United States Patent
Nagai et al.

(10) Patent No.: US 8,784,636 B2
(45) Date of Patent: Jul. 22, 2014

(54) PLATING APPARATUS AND PLATING METHOD

(75) Inventors: Mizuki Nagai, Tokyo (JP); Nobutoshi Saito, Tokyo (JP); Fumio Kuriyama, Tokyo (JP); Akira Fukunaga, Tokyo (JP)

(73) Assignee: Ebara Corporation, Tokyo (JP)

( * ) Notice: Subject to any disclaimer, the term of this patent is extended or adjusted under 35 U.S.C. 154(b) by 682 days.

(21) Appl. No.: 12/314,080

(22) Filed: Dec. 3, 2008

(65) Prior Publication Data

US 2009/0139870 A1   Jun. 4, 2009

(30) Foreign Application Priority Data

| Dec. 4, 2007 | (JP) | 2007-313715 |
| Jun. 30, 2008 | (JP) | 2008-170361 |
| Nov. 13, 2008 | (JP) | 2008-290698 |

(51) Int. Cl.
| C25D 7/12 | (2006.01) |
| C25D 5/10 | (2006.01) |
| C25D 5/08 | (2006.01) |
| C25D 21/10 | (2006.01) |
| C25D 5/00 | (2006.01) |

(52) U.S. Cl.
CPC  *C25D 5/08* (2013.01); *C25D 5/003* (2013.01); *C25D 5/10* (2013.01); *C25D 7/123* (2013.01); *C25D 21/10* (2013.01)
USPC ............ 205/148; 205/105; 205/157; 205/182

(58) Field of Classification Search
USPC ......................................... 205/123, 157, 183
See application file for complete search history.

(56) References Cited

U.S. PATENT DOCUMENTS 3,928,152 A * 12/1975 Harvey et al. ............... 205/576
4,855,020 A *  8/1989 Sirbola ........................ 205/137
(Continued)

FOREIGN PATENT DOCUMENTS

| JP | 62-033800 | 8/1987 |
| JP | 7-292498 | 11/1995 |

(Continued)

OTHER PUBLICATIONS

Kim et al, "Factors Affecting Copper Filling Process Within High Aspect Ratio Deep Vias for 3D Chip Stacking", Electronic Components and Technology Conference, 2006, pp. 838-843.*

(Continued)

*Primary Examiner* — Harry D Wilkins, III
(74) *Attorney, Agent, or Firm* — Wenderoth, Lind & Ponack, L.L.P.

(57) ABSTRACT

A method can form a conductive structure, which is useful for three-dimensional packaging with via plugs, in a shorter time by shortening the conventional long plating time that is an impediment to the practical use of electroplating. The method includes forming a conductive film on an entire surface, including interior surfaces of via holes, of a substrate having the via holes formed in the surface; forming a resist pattern at a predetermined position on the conductive film; carrying out first electroplating under first plating conditions, using the conductive film as a feeding layer, thereby filling a first plated film into the via holes; and carrying out second electroplating under second plating conditions, using the conductive film and the first plated film as a feeding layer, thereby allowing a second plated film to grow on the conductive film and the first plated film, both exposed in the resist openings of the resist pattern.

15 Claims, 24 Drawing Sheets

(56) References Cited

U.S. PATENT DOCUMENTS

| | | | |
|---|---|---|---|
| 5,516,412 A | 5/1996 | Andricacos et al. | |
| 6,197,181 B1 | 3/2001 | Chen | |
| 6,197,182 B1 * | 3/2001 | Kaufman et al. | 205/159 |
| 6,297,155 B1 * | 10/2001 | Simpson et al. | 438/687 |
| 6,354,916 B1 * | 3/2002 | Uzoh et al. | 451/41 |
| 6,709,562 B1 * | 3/2004 | Andricacos et al. | 205/122 |
| 6,806,186 B2 | 10/2004 | Chen et al. | |
| 6,867,136 B2 * | 3/2005 | Basol et al. | 438/687 |
| 2002/0011673 A1 | 1/2002 | Uzoh | |
| 2004/0065551 A1 * | 4/2004 | Zhang | 205/118 |
| 2004/0118691 A1 * | 6/2004 | Kusaka et al. | 205/103 |
| 2004/0222100 A1 * | 11/2004 | Basol | 205/99 |
| 2005/0092611 A1 * | 5/2005 | Kim et al. | 205/123 |
| 2005/0145499 A1 * | 7/2005 | Kovarsky et al. | 205/103 |
| 2005/0274622 A1 * | 12/2005 | Sun et al. | 205/209 |
| 2005/0280112 A1 | 12/2005 | Abbott | |
| 2006/0016693 A1 * | 1/2006 | Wang et al. | 205/291 |
| 2006/0081478 A1 | 4/2006 | Sahoda et al. | |
| 2006/0113185 A1 | 6/2006 | Kuriyama et al. | |
| 2009/0139873 A1 * | 6/2009 | Wang et al. | 205/298 |

FOREIGN PATENT DOCUMENTS

| | | |
|---|---|---|
| JP | 8-225094 | 9/1996 |
| JP | 11-71696 | 3/1999 |
| JP | 2000-64088 | 2/2000 |
| JP | 2003-133698 | 5/2003 |
| JP | 2004-349593 | 12/2004 |
| JP | 2005-8911 | 1/2005 |
| JP | 2006-152415 | 6/2006 |
| JP | 2007-23368 | 2/2007 |
| JP | 2007-177257 | 7/2007 |
| JP | 2007-242693 | 9/2007 |
| JP | 2007-270313 | 10/2007 |

OTHER PUBLICATIONS

Kondo et al, "High Aspect-Ratio Copper-Via-Filling for Three-Dimensional Chip Stacking : II. Reduced Electrodeposition Process Time", Journal of the Electrochemical Society, vol. 152, Issue 11, 2005, pp. H173-H177.*

Vereecken et al, The chemistry of additives in damascene copper plating, IBM Journal of Research and Development, vol. 49, No. 1, Jan. 2005, pp. 3-18.*

* cited by examiner

FIG.10A
FIG.10B
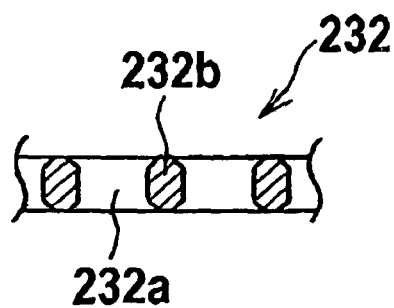
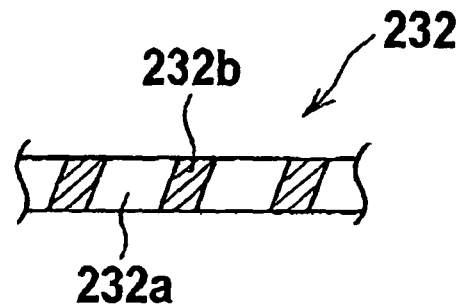

FIG.14A
FIG.14B
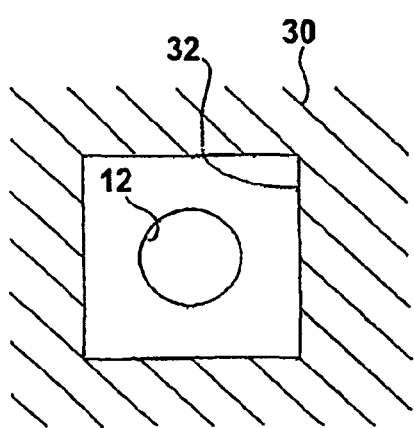
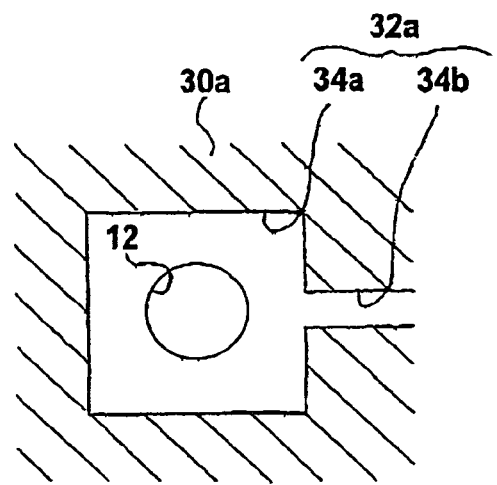

PLATING APPARATUS AND PLATING METHOD

BACKGROUND OF THE INVENTION

1. Field of the Invention

The present invention relates to a method for forming a conductive structure, and more particularly to a method for forming a conductive structure which has, in its interior, via plugs vertically penetrating the structure and, in its surface, electrode pads and/or a rewiring structure connecting to the via plugs, and which can be used in three-dimensional packaging of semiconductor chips utilizing the via plugs.

The present invention also relates to a plating apparatus and a plating method which are useful for filling a metal into via holes in the manufacturing of an interposer or spacer which has a number of via plugs vertically penetrating in its interior, and which can be used in so-called three-dimensional packaging of semiconductor chips.

2. Description of the Related Art

A three-dimensional packaging technology, which involves laminating a plurality of semiconductor chips into a multi-layer package, is attracting attention especially as a technique for achieving higher-density LSI packaging in order to provide smaller-sized and higher-performance electronic products. A wire bonding method for laminating semiconductor chips has already been put into practical use and is currently used, e.g., in packaging for flash memory products, to provide high-capacity products. The wire bonding method, however, has the drawback that wires for connecting electrodes have a length of a millimeter level, which is materially longer that the length of interconnects of a chip. Therefore problems, such as signal delay, would arise when wire bonding is employed in packaging for devices that treat high-speed signals, such as DRAMs and logic devices. A study is therefore being conducted on a three-dimensional packaging technology using via plugs, which involves forming via plugs of a conductive material, such as copper, in a substrate and connecting semiconductor chips with the via plugs by the most direct way, thereby making it possible to provide smaller-sized and higher-performance electronic products.

Semiconductor chips cannot be connected to each other merely by providing via plugs in a substrate. Thus, it is necessary to form electrode pads directly on the via plugs in the surface of the substrate, or to form a rewiring layer for rearrangement of the positions of the electrode pads. It is also conceivable to form a lead-free solder bonding layer on the electrode pads.

FIGS. 1A through 2C illustrate a process for the production of a conductive structure comprising a substrate and having, in an interior of the substrate, via plugs of copper vertically penetrating the substrate, and having, in a surface of the substrate, electrode pads of copper. First, as shown in FIG. 1A, a substrate W having a plurality of upwardly-open via holes (recesses for via plugs) 12, formed by the lithography/etching technique or the like in a base 10 of, e.g., silicon, is provided, and a seed layer (conductive film) 14 of, e.g., copper, which serves as a feeding layer upon electroplating, is formed by sputtering or the like on an entire surface, including interior surfaces of the via holes 12, of the substrate W.

Copper electroplating is carried out on the surface of the substrate W to deposit a first plated film 16 on a surface of the seed layer 14 while filling the via holes 12 with the first plated film 16, as shown in FIG. 1B. Thereafter, the extra first plated film 16, lying outside the via holes 12, is polished away by chemical mechanical polishing (CMP) or the like, as shown in FIG. 1C.

Next, as shown in FIG. 2A, a resist pattern 18 is formed, e.g., with a photoresist at a predetermined position on the surface of the substrate W in such a manner that the positions and the shapes of resist openings 20 correspond to electrode pads to be formed. Thereafter, copper electroplating is carried out on the surface of the substrate W to form a second plated film 22 in the resist openings 20 of the resist pattern 18, as shown in FIG. 2B. Thereafter, as shown in FIG. 2C, the extra seed layer 14 and the resist pattern 18 are removed from the surface (front surface) of the substrate W and, at the same time, the back surface of the substrate W is polished and removed until the bottom of the first plated film 16 embedded in the via holes 12 becomes exposed, thereby obtaining a conductive structure having via plugs 24 of copper, composed of the first plated film 16 embedded in the via holes 12, and having electrode pads 26 composed of the second plated film 22 which has been formed in the resist openings 20 of the resist pattern 18.

FIGS. 3A through 3D illustrate a process for the production of an interposer or a spacer having, in its interior, a plurality of copper via plugs which, when laminating semiconductor substrates in multiple layers, electrically connect the layers. First, as shown in FIG. 3A, a substrate W is provided which has been prepared by depositing an insulating film 512 of, e.g., $SiO_2$ on a surface of a base 510 of, e.g., silicon, and then forming a plurality of upwardly-open via holes 514 by the lithography/etching technique or the like. The diameter "d" of the via holes 514 is, for example, 1 μm to 100 μm, in particular 10 μm to 20 μm, and the depth "h" is, for example, 70 μm to 150 μm. A barrier layer 516 of, e.g., TaN is formed on a surface of the substrate W and then a (copper) seed layer 518, which serves as a feeding layer upon electroplating, is formed on a surface of the barrier layer 516 by sputtering or the like, as shown in FIG. 3B.

Thereafter, copper electroplating is carried out on the surface of the substrate W to deposit a copper plated film 520 over the insulating film 512 while filling the via holes 514 with copper (plated film), as shown in FIG. 3C.

Thereafter, as shown in FIG. 3D, the extra copper film 520, the seed layer 518 and the barrier layer 516 on the insulating film 512 are removed by chemical mechanical polishing (CMP) or the like and, at the same time, the back surface of the substrate W is polished and removed until the bottom surface of the copper embedded in the via holes 514 becomes exposed, thereby obtaining an interposer or a spacer having via plugs 522 of copper vertically penetrating in its interior.

In order to securely fill a metal film into such deep high-aspect ratio via holes, generally having a diameter of 1 μm to 100 μm, in particular 10 to 20 μm, and a depth of 70 μm to 150 μm, formed in a substrate, while preventing the formation of defects such as voids in the embedded metal film, the applicant has proposed a plating apparatus which changes a voltage, applied from a plating power source to between a substrate and an anode, in the course of plating (see Japanese Patent Laid-Open Publication No. 2005-97732) and a plating apparatus which carries out stirring of a plating solution when no voltage is applied between a substrate and an anode, and stops stirring of the plating solution when a voltage is applied between the substrate and the anode (see Japanese Patent Laid-Open Publication No. 2006-152415).

The use of electroplating for the formation of via plugs is being studied, as described above. In order to form via plugs by electroplating, it is necessary to form, in advance of plating, via holes (recesses for via plugs) having a diameter of the order of several to 100 μm and a depth of the order of several tens to several hundred μm, and to fill a plated film of, e.g., copper into the via holes. However, it takes a considerably long time to fill a defect-free plated film into such large via holes by a common electroplating method. The low productivity poses an impediment to the practical use of electroplating in the formation of via plugs. When forming a conductive structure by the process shown in FIGS. 1A through 2C, the process must pass through the number of steps of: plating→CMP→resist formation→plating. This process thus involves a high production cost. It may therefore be considered to form electrode pads, a rewiring layer, and also a bonding solder layer directly on via plugs successively by electroplating. However, because these layers each have a thickness of not less than several μm, it will take a further long time to form the via plugs and the layers successively by electroplating under the same plating conditions.

Further, it has been found that in the plating apparatuses described in the above-cited patent documents, a plated film is formed in excess also in a surface area of a substrate other than via holes, and that because of no countermeasure taken for reducing a thickness of the plated film formed on that surface area, the polishing amount in a later CMP process is large and the production cost is high. This poses an impediment to the practical use of the plating apparatuses. In particular, as shown in FIG. 4, when plating of a substrate surface is carried out to fill holes having a diameter of $D_1$ with a plated film, a plated film having a thickness of $T_1$ is formed also on the substrate surface outside the holes. The thickness $T_1$ will be not less than ½ of the hole diameter $D_1$ ($T_1 > D_1/2$). Therefore, in order to reduce a burden on a later CMP process, it is desirable that the formation of a copper film by plating be performed selectively in via holes with little formation of the copper film in the other area.

It is noted in this regard that when filling via holes of a substrate with a metal copper by plating, if the rates of the growth of plating inside and outside the via holes are equal, a thickness of a plated film, which is the same as the radius of the via holes, is needed. If no countermeasure is taken, a plated film having the same thickness will be formed also in the surface area, other than the via holes, of the substrate. Though the growth of plating can be suppressed to some extent, e.g., by the use of an additive in a plating solution, it is not enough.

SUMMARY OF THE INVENTION

The present invention has been made in view of the above situation. It is therefore a first object of the present invention to provide a method for forming a conductive structure which can form a conductive structure, which is useful for three-dimensional packaging with via plugs, in a shorter time by shortening the conventional long plating time that is an impediment to the practical use of electroplating.

It is a second object of the present invention to provide a plating apparatus and a plating method which can perform the formation of a metal film by plating selectively in via holes, thereby filling the via holes with the metal film without a defect in the film while minimizing a thickness of an extra metal film formed outside the via holes.

In order to achieve the first object, the present invention provides a method for forming a conductive structure, comprising: forming a conductive film on an entire surface, including interior surfaces of via holes, of a substrate having the via holes formed in the surface; forming a resist pattern at a predetermined position on the conductive film; carrying out first electroplating under first plating conditions, using the conductive film as a feeding layer, thereby filling a first plated film into the via holes; and carrying out second electroplating under second plating conditions, using the conductive film and the first plated film as a feeding layer, thereby allowing a second plated film to grow on the conductive film and the first plated film, both exposed in the resist openings of the resist pattern.

There are large differences in pattern configuration and in the structure of feeding layer between the case where a plated film of, e.g., copper as a metal material is filled by electroplating into via holes formed by etching or the like in a substrate surface (case (1)) and the case where a plated film of, e.g., copper as a metal material is formed by electroplating in resist openings of a resist pattern formed on the substrate surface (case (2)). The via holes in the case (1) have, for example, a diameter of several to several tens of μm, a depth of 10 μm to 100 μm and an aspect ratio (ratio of depth to diameter) of not less than 1, whereas the resist pattern in the case (2) has, for example, a thickness of several to several tens of μm and a resist opening size or width of several to several tens of μm.

In the case (1), the aspect ratio of the via holes is not less than 1 and a seed layer (feeding layer) is present also in the side surfaces of the via holes. Accordingly, unless the plated film is formed under bottom-up growth conditions for preferential growth of the plated film from the bottoms of the via holes, the plated film grows preferentially at the entrances of the via holes, resulting in the formation of defects, such as voids and seams, in the metal film embedded in the via holes. It is therefore necessary to optimize some plating conditions. An exemplary method is to use a plating solution containing an additive capable of effectively suppressing the growth of the plated film at the entrances of the via holes and, in addition, repeat the operation of first carrying out plating at a certain current for a certain period of time, and then temporarily lowering the current value to wait for recovery of the consumption of copper ions in the via holes.

In the case (2), the feeding layer is present only in the bottoms of the resist openings surrounded by the resist pattern. Accordingly, the plated film grows from the bottoms of the resist openings by through-mask plating when electroplating is carried out. There is, therefore, little fear of the formation of defects, such as voids and seams, in the plated film. However, there is a possibility of disproportion in the pattern configuration of the plated film due to the flow rate distribution of the plating solution in the resist pattern. This phenomenon is likely to occur when supply of copper ions is insufficient for the plating rate, i.e., when plating proceeds in a diffusion-controlled region. In this case, therefore, optimization of the flow conditions of the plating solution, e.g., by mechanical stirring or air stirring is important rather than the composition of the plating solution and the current density.

When filling a plated film into via holes lying under resist openings, the plating is more affected by the concentration distribution of a plating solution present in the resist pattern than plating for filling a plated film into the resist openings. Accordingly, in addition to the optimization of an additive of the plating solution and the electric current conditions as in the case (1), optimization of the flow conditions of the plating solution is important.

As described above, in order to increase the completeness of a plated film and the efficiency of film formation, the plating conditions, such as electric current, the composition of plating solution and stirring conditions for the plating solution, are required to be optimized for the configuration of via holes or resist openings. The present invention can meet the requirement by carrying out first electroplating under first plating conditions to fill a first plated film into via holes, and then carrying out second electroplating under second plating conditions to allow a second plated film to grow in resist openings of a resist pattern formed at a predetermined position on a conductive film. Furthermore, by carrying out the first electroplating to fill the first plated film into the via holes and the second electroplating to allow the second plated film to grow in the resist openings of the resist pattern successively after forming the resist pattern in advance, it becomes possible to shorten the plating time and increase the productivity.

The height of the resist pattern is preferably 5 μm to 100 μm.

In cases where re-wirings are formed using the second plated film formed in the resist openings in the substrate surface, a thickness of the second plated film needs to be at least about 5 μm in view of the frequencies of electrical signals passing through the re-wirings, the current value to be fed, etc. In cases where electrode pads or posts are formed using the second plated film formed in the resist openings in the substrate surface, a thickness of the second plated film is desirably on the order of several tens of μm in view of later bonding. When it is intended to deposit a bonding material, such as solder, on the electrodes pads by electroplating, the resist pattern needs an additional height of the order of several tens of μm. Therefore, the height of the resist pattern is preferably not less than 5 μm and not more than 100 μm.

The first plated film and the second plated film are preferably composed of copper or a copper alloy.

The first plated film embedded in the via holes can be used as via plugs which connect semiconductor chips by the most direct way to achieve the production of a higher-performance and smaller-sized electronic product. It is therefore desirable that the first plated film have a high electrical conductivity, i.e., a low electrical resistance. Though gold, silver, copper, etc. may be mentioned as such metals, only copper or copper-based alloy plating is capable of industrial bottom-up plating. Also from the viewpoint of cost, it is preferred to use copper or a copper alloy at least for the first plated film to be formed under the first plating conditions.

With regard to the second plated film to be formed by the second electroplating carried out under the second plating conditions, it is desirable to use a highly conductive metal also for the second plated film. In addition, it is desirable in view of the productivity to successively form the first plated film and the second plated film, both composed of the same metal. Therefore, the second plated film is also preferably composed of copper or a copper alloy.

An average current value in the second plating conditions is preferably higher than an average current value in the first plating conditions.

From the viewpoint of ensuring an area for devices, the total area of via holes is generally at most about 1%, and in no way exceeds several % of the total area of a substrate. The area of re-wirings or electrode pads, on the other hand, is generally several to several tens of % of the total area of a substrate. Accordingly, in the first electroplating under the first plating conditions, it is only necessary to supply an electric current required to fill the via holes with the first plated film. On the other hand, it will take a long plating time if the second electroplating under the second plating conditions for the formation of the second plated film, which may become re-wirings or electrode pads, is carried out at the same current as the first electroplating. In view of this, an average current value in the second plating conditions is preferably higher than an average current value in the first plating conditions.

In a preferred aspect of the present invention, the second plated film is allowed to grow halfway to a top of the resist pattern, and then third electroplating is carried out under third plating conditions to allow a third plated film to grow on the second plated film.

By thus forming the third plated film on the second plated film, the third plated film can be used as a bonding material for bonding between chips. The successive formation of the third plated film on the second plated film, which is for forming electrode pads or posts, can eliminate the need for provision of a new resist pattern that leads to increased cost. It is desirable that the third plating conditions, such as the composition of the plating solution used and the current density, be optimized for the third electroplating. The third plating conditions may therefore be different from the first and second plating conditions.

The third plated film is preferably composed of a metal different from the metal of the first plated film and the metal of the second plated film.

The third plated film is for use as a bonding material for which bonding properties take priority over electrical conductivity. Thus, a metal such as tin or a tin alloy, which is different from metals, such as copper, for use in the first plated film and the second plated film, is preferably used.

Preferably, the filling of the first plated film into the via holes is terminated before the via holes become entirely filled with the first plated film.

Thus, the first plating conditions are changed to the second plating conditions before the via holes become entirely filled with the first plated film, i.e. when the first plated film embedded in each via hole still has a somewhat concave surface. This can prevent the surface of the first plated film embedded in each via hole from taking a convex shape. If the second electroplating is carried out on such first plated film having convex surface portions, the second plated film formed will have a thicker thickness in its portions corresponding to the centers of the via holes than in the other portions.

Preferably, before the via holes become entirely filled with the first plated film, plating is carried out at a second current value lower than a first current value for a predetermined time, the plating being carried out at least once.

By thus carrying out the plating at a second current value lower than a first current value for a predetermined time before the via holes become entirely filled with the first plated film, it becomes possible to wait for recovery of the consumption of ions in the via holes.

Preferably, the plating is carried out while stirring a plating solution with a stirring paddle moving approximately parallel to the substrate surface.

As described above, when carrying out plating in resist openings surrounded by the resist pattern, due to the flow rate distribution of a plating solution in the resist pattern, there is a possibility of disproportion in the pattern configuration of plated film, resulting in failure to obtain a flat plated film. The supply of the plating solution into the resist openings can be promoted and the disproportion in the pattern configuration can be reduced by supplying the plating solution in an upward flow into, e.g., a vertical plating apparatus, and reciprocating the stirring paddle at a high velocity approximately parallel to the substrate to move the plating solution during plating. Besides simple reciprocation of the stirring paddle, it is also possible to reciprocate the paddle while slowly moving the center of reciprocation in one direction.

The plating may also be carried out while stirring a plating solution with a stirring paddle rotating with respect to the substrate surface.

Besides the use of the reciprocating stirring paddle, the use of the rotating stirring paddle can also promote the supply of a plating solution into the resist openings. Thus, the supply of the plating solution into the resist openings can be promoted and the disproportion in the pattern configuration can be reduced by supplying the plating solution in an upward flow into, e.g., a jet flow-type plating apparatus, and rotating the stirring paddle with respect to the substrate surface to move the plating solution during plating. In view of the relatively slow movement of the plating solution in the vicinity of the center of rotation of the stirring paddle, it is possible to position the center of rotation of the stirring paddle at a distance from the center of the substrate, and to rotate the stirring paddle while slowly moving the center of rotation with respect to the substrate surface, so that a uniform flow of the plating solution will form over the entire substrate surface.

According to the method for forming a conductive structure of the present invention, a conductive structure for use in three-dimensional packaging with via pugs can be formed with high in-plane uniformity of plated film at a practical cost in a practical time. Further, it is possible to simultaneously form a film of bonding material for bonding of semiconductor chips.

In order to achieve the second object, the present invention provides a plating apparatus comprising: a plating tank for holding a plating solution; an anode to be immersed in the plating solution in the plating tank; a substrate holder for holding a substrate and disposing the substrate, to be immersed in the plating solution, at a position opposite the anode; a plating solution stirring section, disposed between the anode and the substrate held by the substrate holder, for stirring the plating solution in the plating tank; a bubble supply section for supplying bubbles to the plating solution facing a surface to be plated of the substrate held by the substrate holder and immersed in the plating solution; and a plating power source for applying a voltage between the substrate and the anode.

The present inventors have conducted experiments and studies on a copper plating method which can deposit copper preferentially in holes provided in a surface of a semiconductor substrate and can completely fill the holes with copper without a defect while minimizing deposition of copper on the substrate surface outside the holes. As a result, it has been found that the object can be achieved by using a plating solution which, in addition to copper ions, a supporting electrolyte and halogen ions, contains at least one of an organic sulfur compound, a polymer and an organic nitrogen compound, and carrying out electroplating by applying a voltage between a substrate and an anode while stirring the plating solution with a paddle and supplying bubbles to the plating solution.

For example, it has been confirmed that when plating is carried out by applying a voltage between an anode and a substrate with holes (via holes), having a diameter of about 1 μm to 100 μm, formed in the surface while stirring a plating solution with a plating solution stirring section and supplying bubbles to the plating solution, plating proceeds preferentially in the holes, so that a thickness of a plated film of, e.g., copper, formed on the substrate surface outside the holes which are filled with the plating metal, can be made smaller than the radius of the holes.

In a preferred aspect of the present invention, the bubble supply section is located either between the plating solution stirring section and the substrate, held by the substrate holder and immersed in the plating solution, or in the vicinity of the plating solution stirring section, and disposed along the bottom of the plating tank.

In a preferred aspect of the present invention, the supply rate of bubbles is 0.1 L/min to 10 L/min.

The supply rate of bubbles is generally 0.1 L/min to 10 L/min, preferably 1 L/min to 5 L/min.

In a preferred aspect of the present invention, the bubble supply section is comprised of a hollow pipe having, in its lower half portion, a plurality of through-holes arranged in a line or lines at a predetermined pitch.

The diameter of the through-holes is, for example, 0.1 mm to 2.0 mm.

The bubble supply section may be comprised of a porous body.

The porous body may be a porous plastic or ceramic body. The use of a porous body can simplify the structure of the bubble supply section.

The present invention also provides a plating method comprising: disposing a substrate and an anode opposite to each other in a plating solution in a plating tank; applying a voltage between the substrate and the anode; and supplying bubbles to the plating solution facing a surface to be plated of the substrate while stirring the plating solution between the substrate and the anode with a plating solution stirring section.

In a preferred aspect of the present invention, bubbles are supplied from the bottom of the plating tank to the plating solution lying either between the plating solution stirring section and the substrate, or in the vicinity of the plating solution stirring section.

The supply rate of bubbles is, for example, 0.1 L/min to 10 L/min.

According to the plating apparatus and the plating method of the present invention, when carrying out plating of a surface of a substrate with holes (via holes), having a diameter of about 1 μm to 100 μm, formed in the surface, plating is allowed to proceed preferentially in the holes, so that a thickness of a plated film of, e.g., copper, formed on the substrate surface outside the holes which are filled with the plating metal, can be made smaller than the radius of the holes.

BRIEF DESCRIPTION OF THE DRAWINGS

FIGS. 10A and 10B are diagrams corresponding to FIG. 9, showing variations of the stirring paddle;

FIG. 14A is a plan view of FIG. 12B, and FIG. 14B is a plan view of a different resist pattern;

DETAILED DESCRIPTION OF THE PREFERRED EMBODIMENTS

Preferred embodiments of the present invention will now be described with reference to the drawings.

Figure 5:
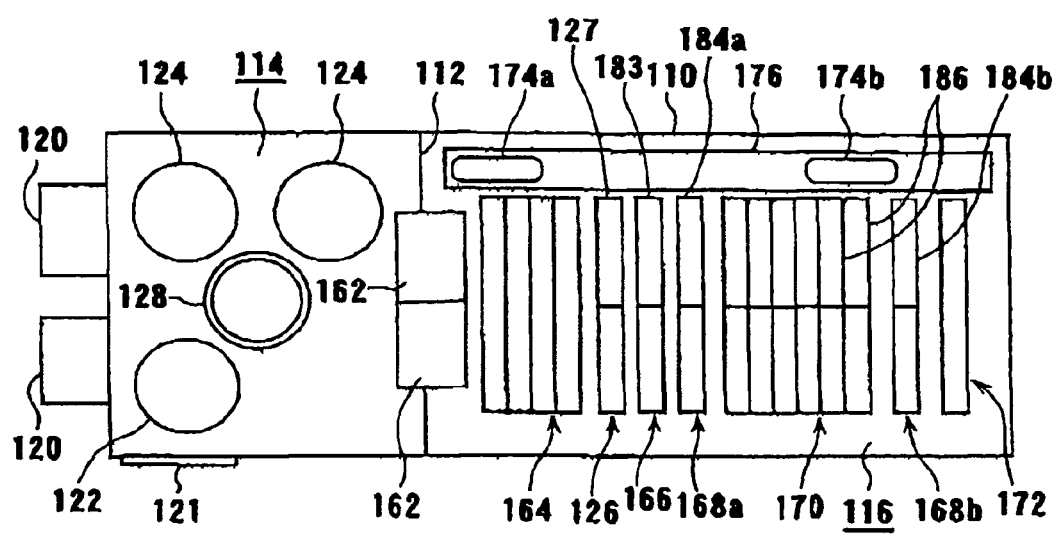
FIG. 5 is a schematic view of the overall layout of a plating facility provided with a plating apparatus (electroplating apparatus) for use in the present invention.

FIG. 5 is a schematic view of the overall layout of a plating facility (electroplating facility) for use in a method for forming a conductive structure of the present invention. The plating facility is designed so as to automatically perform all the plating processes including pretreatment of a substrate, plating, and post-treatment of the plating, in a successive manner. The interior of an apparatus frame 110 having an armored panel attached thereto is divided by a partition plate 112 into a plating space 116 for performing a plating process of a substrate and treatments of the substrate to which a plating solution is attached, and a clean space 114 for performing other processes, i.e., processes not directly involving a plating solution. Two substrate holders 160 (see FIG. 6) are arranged in parallel, and substrate attachment/detachment stages 162 to attach a substrate to and detach a substrate from each substrate holder 160 are provided as a substrate delivery section on a partition portion partitioned by the partition plate 112, which divides the plating space 116 from the clean space 114. Loading/unloading ports 120, on which substrate cassettes storing substrates are mounted, are connected to the clean space 114. Further, the apparatus frame 110 has a console panel 121 provided thereon.

In the clean space 114, there are disposed an aligner 122 for aligning an orientation flat or a notch of a substrate with a predetermined direction, two cleaning/drying devices 124 for cleaning a plated substrate and rotating the substrate at a high speed to spin-dry the substrate. Further, a first transfer robot 128 is disposed substantially at the center of these processing devices, i.e. the aligner 122 and the cleaning/drying devices 124, to thereby transfer and deliver a substrate between the processing devices 122, 124, the substrate attachment/detachment stages 162, and the substrate cassettes mounted on the loading/unloading ports 120.

The aligner 122 and the cleaning/drying devices 124 disposed in the clean space 114 are designed so as to hold and process a substrate in a horizontal state in which a front face of the substrate faces upward. The transfer robot 128 is designed so as to transfer and deliver a substrate in a horizontal state in which a front face of the substrate faces upward.

In the plating space 116, in the order from the partition plate 112, there are disposed a stocker 164 for storing or temporarily storing the substrate holders 160, a pretreatment device 126 for carrying out, e.g., a rinsing pretreatment for cleaning the substrate surface with pure water and enhancing a hydrophilicity of the substrate surface by wetting with pure water, an activation treatment device 166 for etching, for example, an oxide film, having a large electric resistance, on a seed layer formed on the surface of the substrate with an inorganic acid solution, such as sulfuric acid or hydrochloric acid, or an organic acid solution, such as citric acid or oxalic acid, to remove the oxide film, a first rinsing device 168a for rinsing the surface of the substrate with pure water, a plating apparatus (copper electroplating apparatus) 170 for carrying out plating (copper electroplating), a second rinsing device 168b, and a blowing device 172 for dewatering the plated substrate. Two second transfer robots 174a and 174b are disposed beside these devices so as to be movable along a rail 176. One of the second transfer robots 174a transfers the substrate holders 160 between the substrate attachment/detachment stages 162 and the stocker 164. The other of the second transfer robots 174b transfers the substrate holders 160 between the stocker 164, the pretreatment device 126, the activation treatment device 166, the first rinsing device 168a, the plating apparatus 170, the second rinsing device 168b, and the blowing device 172.

Figure 6:
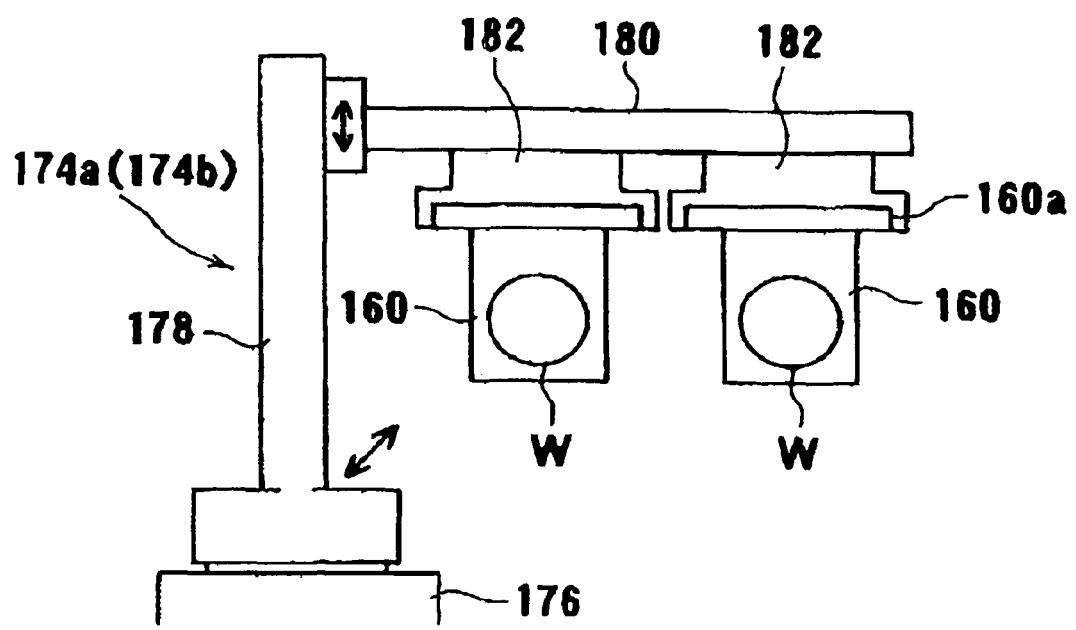
FIG. 6 is a schematic view of a transfer robot provided in the plating facility shown in FIG. 5.

As shown in FIG. 6, each of the second transfer robots 174a and 174b has a body 178 extending in a vertical direction and an arm 180 which is vertically movable along the body 178 and rotatable about its axis. The arm 180 has two substrate holder retaining portions 182 provided in parallel for detachably retaining the substrate holders 160. The substrate holder 160 is designed so as to hold a substrate W in a state in which a front face of the substrate is exposed while a peripheral portion of the substrate is sealed, and to be capable of attaching the substrate W to the substrate holder 160 and detaching the substrate W from the substrate holder 160.

The stocker 164, the pretreatment device 126, the activation treatment device 166, the rinsing devices 168a, 168b, the plating apparatus 170, and the blowing device are designed so as to engage with outwardly projecting portions 160a provided at both ends of each substrate holder 160 to thus support the substrate holders 160 in such a state that the substrate holders 160 are suspended in a vertical direction. The pretreatment device 129 has two pretreatment tanks 127 for holding pure water therein. As shown in FIG. 6, the arm 180 of the second transfer robot 174b holding the substrate holders 160, which are loaded with the substrates W in a vertical state, is lowered so as to engage with upper ends of the pretreatment tanks 127 to support the substrate holders 160 in a suspended manner. Thus, the pretreatment device 126 is designed so that the substrate holders 160 are immersed together with the substrates W in the pure water in the pretreatment tanks 127 to carry out a pretreatment. The activation treatment device 166 has two activation treatment tanks 183 for holding a chemical liquid therein. As shown in FIG. 6, the arm 180 of the second transfer robot 174b holding the substrate holders 160, which are loaded with the substrates W, in a vertical state, is lowered so as to engage with upper ends of the activation treatment tanks 183 to support the substrate holders 160 in a suspended manner. Thus, the activation treatment device 166 is designed so that the substrate holders 160 are immersed together with the substrates W in the chemical liquid in the activation treatment tanks 183 to carry out an activation treatment.

Similarly, the rinsing devices 168a and 168b have two rinsing tanks 184a and two rinsing tanks 184b which hold pure water therein, respectively, and the plating apparatus 170 has a plurality of plating tanks 186 which hold a plating solution therein. The rinsing devices 168a, 168b and the plating apparatus 170 are designed so that the substrate holders 160 are immersed together with the substrates W in the pure water in the rinsing tanks 184a, 184b or the plating solution in the plating tanks 186 to carry out rinsing treatment or plating in the same manner as described above. The arm 180 of the second transfer robot 174b holding the substrate holders 160 with substrates W in a vertical state is lowered, and air or inert gas is injected toward the substrates W mounted on the substrate holders 160 to blow away a liquid attached to the substrate holders 160 and the substrates W and to dewater the substrates W. Thus, the blowing device 172 is designed so as to carry out blowing treatment.

Figure 7:
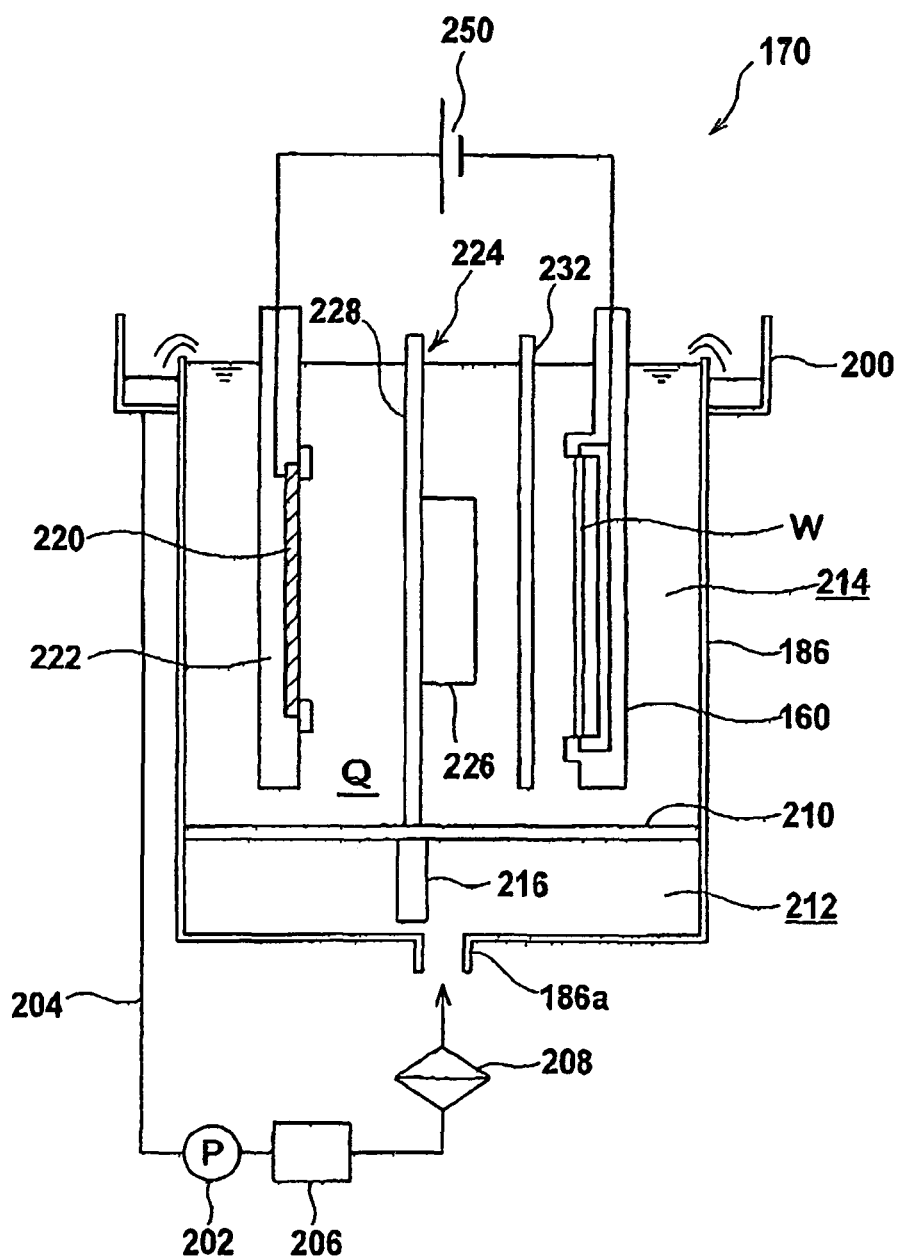
FIG. 7 is a schematic cross-sectional view of a plating apparatus provided in the plating facility shown in FIG. 5.

As shown in FIG. 7, each plating tank 186 provided in the plating apparatus 170 is designed so as to hold a predetermined amount of plating solution Q therein. The substrates W, which are held in a state such that the front faces (surfaces to be plated) are exposed while peripheral portions of the substrates are watertightly sealed by the substrate holder 160, are immersed in the plating solution Q in a vertical direction. In this embodiment, a plating solution which, in addition to copper ions, a supporting electrolyte and halogen ions, contains at least one of an organic sulfur compound, a polymer and an organic nitrogen compound, is used as the plating solution Q. Sulfuric acid is preferably used as the supporting electrolyte, and chlorine ions are preferably used as the halogen ions.

An overflow tank 200 for receiving the plating solution Q that has overflowed an edge of the plating tank 186 is provided around an upper end of the plating tank 186. One end of a circulation piping 204, which is provided with a pump 202, is connected to a bottom of the overflow tank 200, and the other end of the circulation piping 204 is connected to a plating solution supply inlet 186a provided at a bottom of the plating tank 186. The plating solution Q in the overflow tank 200 is returned into the plating tank 186 by the actuation of the pump 202. Located downstream of the pump 202, a constant-temperature unit 206 for controlling the temperature of the plating solution Q and a filter 208 for filtering out foreign matter contained in the plating solution are interposed in the circulation piping 204.

A bottom plate 210, having a large number of plating solution passage holes therein, is installed in the bottom of the plating tank 186. The interior of the plating tank 186 is thus separated by the bottom plate 210 into an upper substrate processing chamber 214 and a lower plating solution distribution chamber 212. Further, a shield plate 216, extending vertically downward, is mounted to the lower surface of the bottom plate 210.

According to the plating apparatus 170 of this embodiment, the plating solution Q is introduced into the plating solution distribution chamber 212 of the plating tank 186 by the actuation of the pump 202, flows into the substrate processing chamber 214 passing through the plating solution passage holes provided in the bottom plate 210, flows vertically approximately parallel to the surface of the substrate W held by the substrate holder 160, and then flows into the overflow tank 200.

An anode 220 having a circular shape corresponding to the shape of the substrate W is held by an anode holder 222 and provided vertically in the plating tank 186. When the plating solution Q is filled in the plating tank 186, the anode 220 becomes immersed in the plating solution Q and faces the substrate W held by the substrate holder 160 and disposed at a predetermined position in the plating tank 186. Further, in the plating tank 186, a regulation plate 224, for regulating the distribution of electric potential in the plating tank 186, is disposed between the anode 220 and the substrate W to be disposed at a predetermined position in the plating tank 186. In this embodiment, the regulation plate 224 is comprised of a cylindrical portion 226 and a rectangular flange portion 228, and is made of polyvinyl chloride that is a dielectric material. The cylindrical portion 226 has such an opening size and axial length as to sufficiently restrict broadening of electric field. A lower end of the flange portion 228 of the regulation plate 224 reaches the bottom plate 210.

Between the regulating plate 224 and the substrate W to be disposed at a predetermined position in the plating tank 186 is disposed a vertically-extending stirring paddle 232 which reciprocates parallel to the surface of the substrate W to stir the plating solution Q between the substrate W and the regulating plate 224. By stirring the plating solution Q with the stirring paddle 232, a sufficient amount of copper ions can be supplied uniformly to the surface of the substrate W. The distance between the stirring paddle 232 and the surface of the substrate W, for obtaining a sufficient stirring effect by the stirring paddle 232, is preferably not more than 30 mm, more preferably not more than 15 mm, while the stirring paddle 232 is not in contact with the substrate holder 160.

Figure 8:
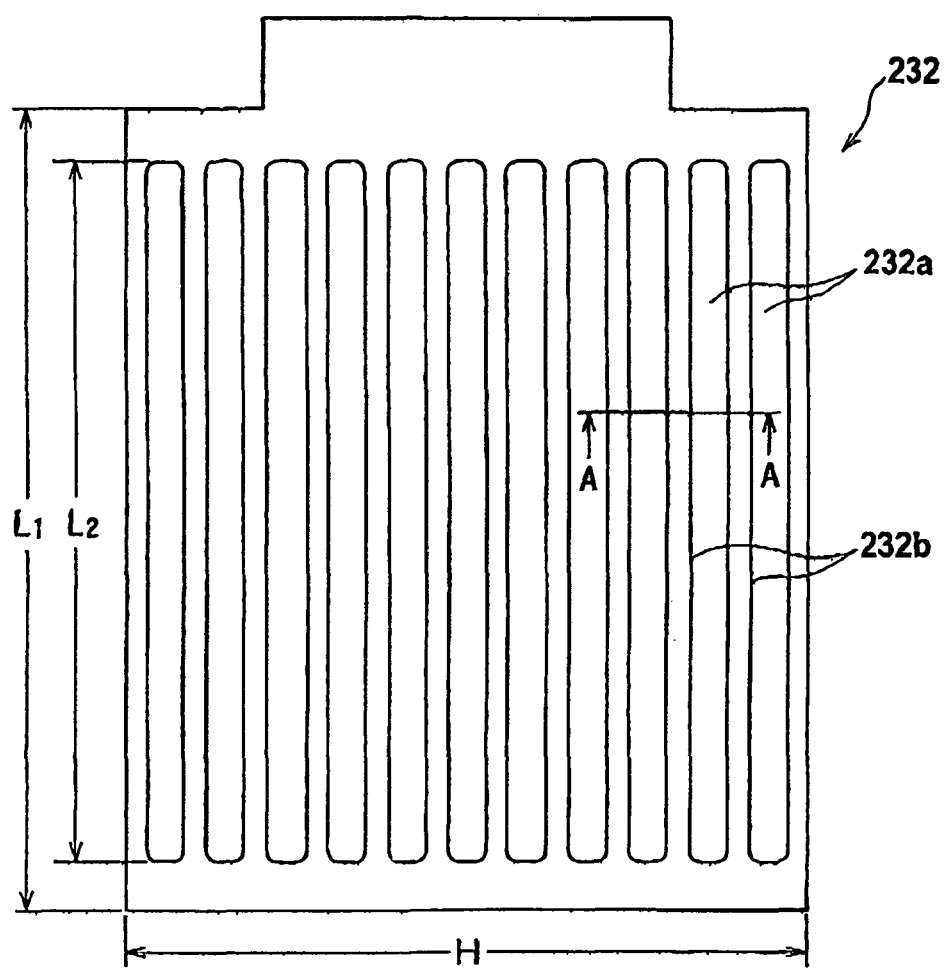
FIG. 8 is a plan view of a stirring paddle for use in the plating apparatus shown in FIG. 7.
Figure 9:
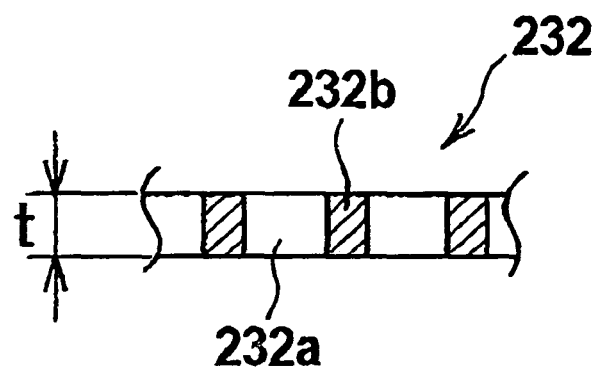
FIG. 9 is a cross-sectional diagram taken along line A-A of FIG. 8.

As shown in FIGS. 8 and 9, the stirring paddle 232 is comprised of a rectangular plate-like member having a uniform thickness "t" of 3 mm to 5 mm, and has a plurality of parallel slits 232a that define vertically-extending strip-like portions 232b. The stirring paddle 232 is formed of, for example, titanium with a Teflon coating. The vertical length $L_1$ of the stirring paddle 232 and the vertical length $L_2$ of the slits 232a are sufficiently larger than the vertical size of the substrate W. Further, the stirring paddle 232 is so designed that the sum of its lateral length H and its reciprocation distance (stroke "St") is sufficiently larger than the lateral size of the substrate W.

It is preferred that the width and the number of the slits 232a be determined such that each strip-shaped portion 232b is as narrow as possible insofar as it has the necessary rigidity so that the strip-shaped portions 232b between the slits 232a can efficiently stir the plating solution and, in addition, the plating solution can efficiently pass through the slits 232a.

In this embodiment, as shown in FIG. 9, the slits 232a are formed vertically such that each strip-shaped portion 232b has a rectangular cross section. As shown in FIG. 10A, each strip-shaped portion 232b may be chamfered at the four corners in its cross section or, as shown in FIG. 10B, each strip-shaped portion 232b may be angled so that it has a parallelogram cross-sectional shape.

Figure 11:
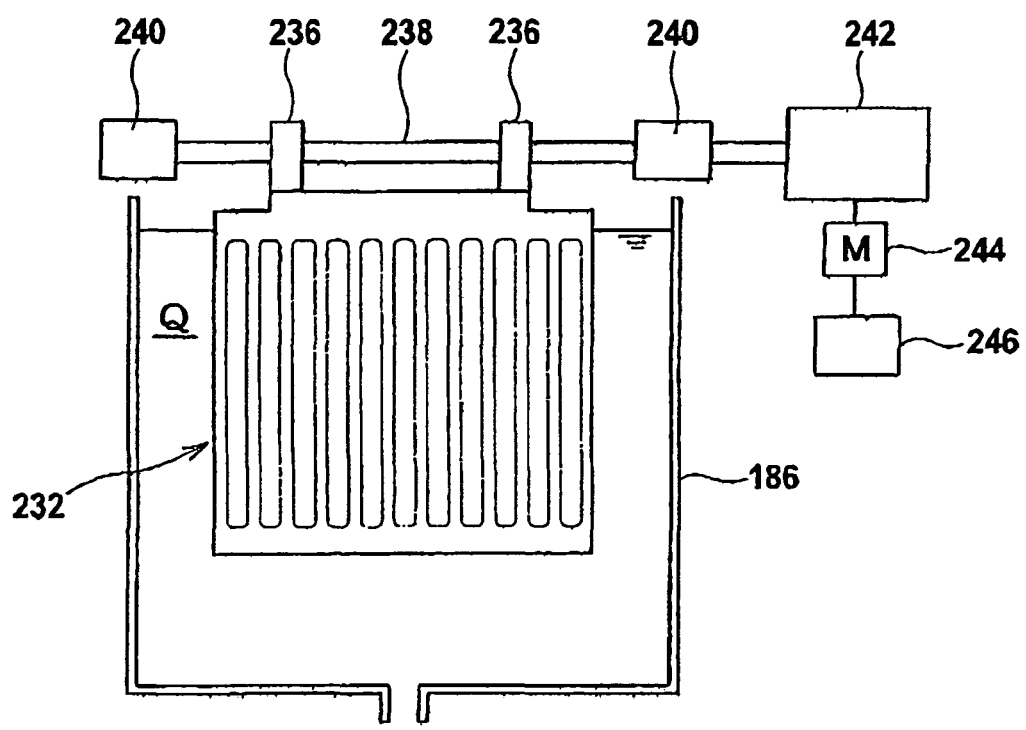
FIG. 11 is a schematic diagram showing a paddle drive mechanism of the plating apparatus shown in FIG. 7 together with a plating tank.

As shown in FIG. 11, the stirring paddle 232 is secured to a horizontally-extending shaft 238 by clamps 236 fixed to the upper end of the stirring paddle 232. The shaft 238 is held by shaft holders 240 and can slide horizontally. An end of the shaft 238 is coupled to a paddle drive section 242 for reciprocating the stirring paddle 232 linearly and horizontally. The paddle drive section 242 converts the rotation of a motor 244 into the linear reciprocating movement of the shaft 238 by a crank mechanism (not shown). In this embodiment, a control section 246, which controls the movement velocity of the stirring paddle 232 by controlling the rotational speed of the motor 244 of the paddle drive section 242, is provided. Instead of the paddle drive section 242 which uses the crank mechanism, it is also possible to use a paddle drive section which converts the rotation of a servomotor into the linear reciprocating movement of a shaft by means of a ball screw, or a paddle drive section which linearly reciprocates a shaft by means of a linear motor. A movement velocity of the stirring paddle 232, for obtaining a sufficient stirring effect by the stirring paddle 232, is preferably not less than 0.2 m/sec, more preferably not less than 0.5 m/sec. From the viewpoint of an apparatus design, the movement velocity of the stirring paddle 232 is not more than 2.0 m/sec.

The plating apparatus 170 is provided with a plating power source 250 of which the anode is connected via a conducting wire to the anode 220 and the cathode is connected via a conducting wire to the substrate W during plating. In this embodiment, a power source having a feeding current range covering at least tenfold increase of current is used as the plating power source 250.

In the operation of the plating apparatus 170, a predetermined amount of plating solution Q, having a predetermined composition, is first filled in the plating tank 186 and circulated, as described above. The substrate holder 160 holding the substrate W is then lowered to dispose the substrate W at a predetermined position within the plating tank 186 where the substrate W is immersed in the plating solution Q. The anode 220 is connected to the anode of the plating power source 250, and the substrate W is connected via to the cathode of the plating power source 250. In this state, the stirring paddle 232 is reciprocated parallel to the surface of the substrate W to thereby stir the plating solution Q between the regulation plate 224 and the substrate W, as necessary. As a result, a plated film is deposited on the surface of the substrate W. The pump 202 of the circulation piping 204 is driven, as necessary, to circulate the plating solution Q while cooling the plating solution Q to keep it at a predetermined temperature. After the elapse of a predetermined time, the application of voltage between the anode 202 and the substrate W and the reciprocation of the stirring paddle 232 are stopped to terminate the plating.

A method for forming a conductive structure, according to an embodiment of the present invention, will now be described.

Figure 12A:
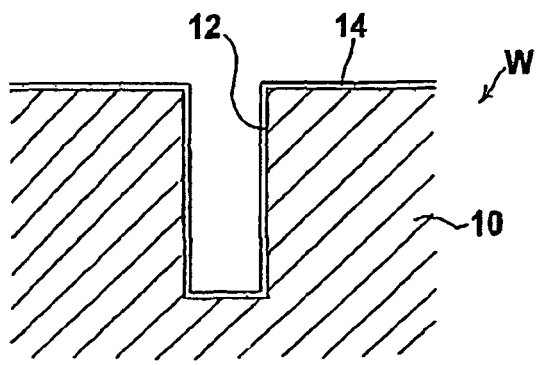
FIGS. 12A through 12C are diagrams illustrating the steps, up to the formation of a first plated film, of a process for the production of a conductive structure, according to an embodiment of the present invention.

FIGS. 12A through 13B illustrate a process for the production of a conductive structure comprising a substrate and having, in the interior of the substrate, via plugs of copper vertically penetrating the substrate, and having, in the surface of the substrate, electrode pads of copper. First, as shown in FIG. 12A, a substrate W having a plurality of upwardly-open via holes 12, formed by the lithography/etching technique or the like in a base 10 of, e.g., silicon, is provided, and a seed layer (conductive film) 14 of copper, which serves as a feeding layer upon electroplating, is formed by sputtering or the like on the entire surface, including the interior surfaces of the via holes 12, of the substrate W.

Figure 12B:
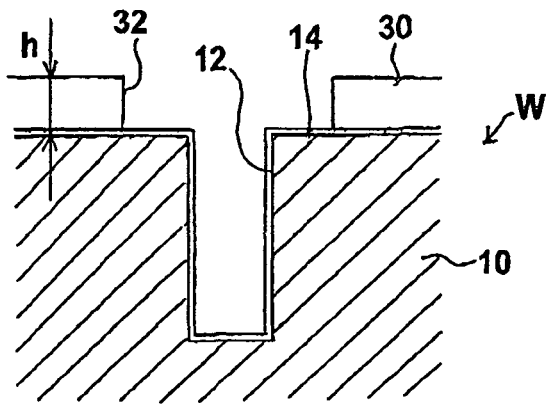

Next, as shown in FIG. 12B, a resist pattern 30 is formed, e.g., with a photoresist at a predetermined position on the surface of the substrate W. In this embodiment, electrode pads 42 (see FIG. 13B) of copper are to be formed on the surface of the substrate W. Therefore, as shown in FIG. 14A, the resist openings 32 of the resist pattern 30 are each positioned right above each via hole 12, and each have a rectangular or circular shape conforming to the shape of the electrode pad which is larger than the via hole 12.

In cases where re-wirings for rearrangement of the positions of the electrode pads are to be formed on the surface of the substrate W, the resist openings 32a of the resist pattern 30a are comprised of electrode pad portions 34a, positioned right above the via holes 12, and wiring portions 34b extending from the electrode pad portions 34a and conforming to the shapes of re-wirings, as shown in FIG. 14B.

The height "h" of the resist pattern 30 is preferably 5 μm to 100 μm. As described below, a second plated film 38 is formed in the resist openings 32 for use as electrode pads or re-wirings. In the case of re-wirings, their thickness needs to be at least about 5 μm in view of the frequencies of electrical signals passing through the re-wirings, the current value to be fed, etc. In the case of electrode pads or posts, their thickness is desirably on the order of several tens of μm in view of later bonding conditions. When it is intended to form a third plated film 44 of, e.g., solder, for use as a bonding layer, on the second plated film, as described below, the resist pattern 30 needs an additional height of the order of several tens of μm. Therefore, the resist pattern 30, having a height of not less than 5 μm and not more than 100 μm, will allow for the formation of the second plated film 38 and the third plated film 44, both having sufficient thicknesses, in the resist openings 32.

Figure 12C:
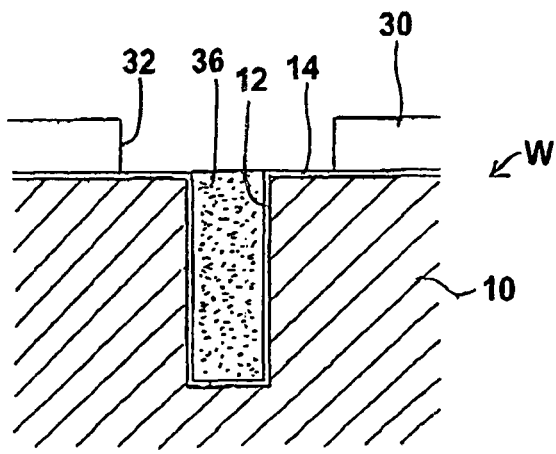

Next, as shown in FIG. 12C, using the seed layer 14 as a feeding layer, first electroplating is carried out under first plating conditions by passing a predetermined plating current between the seed layer 14 and the anode 220, thereby filling a first plated film 36 into the via holes 12. The first plated film may be formed also on the surface of the seed layer 14 lying in the resist openings 32 and outside the via holes 12.

In this case, the aspect ratio of the via holes 12 is not less than 1 and the seed layer 14 as a feeding layer is present also in the side surfaces of the via holes 12. Accordingly, unless the first plated film 36 is formed under bottom-up growth conditions for preferential growth of the plated film from the bottoms of the via holes 12, the plated film grows preferentially at the entrances of the via holes 12, resulting in the formation of defects, such as voids and seams, in the first plated film 36 embedded in the via holes 12. It is therefore necessary to optimize the first plating conditions for the first electroplating. An exemplary method is to use a plating solution containing an additive capable of effectively suppressing the growth of the plated film at the entrances of the via holes 12 and, in addition, repeat the operation of first carrying out plating at a certain current for a certain period of time, and then temporarily lowering the current to wait for recovery of the consumption of copper ions in the via holes 12.

Figure 15A:
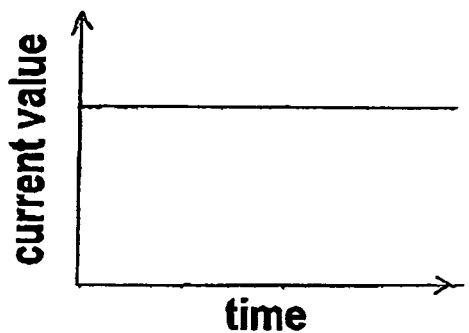
FIGS. 15A through 15C are graphs showing various relationships between current value and time in first electroplating carried out under first plating conditions.
Figure 15B:
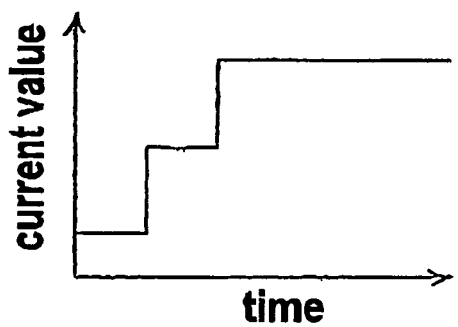
Figure 15C:
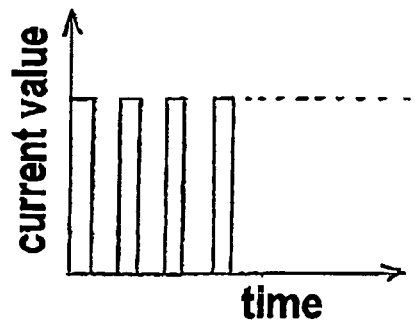

The electric current applied between the seed layer 14 and the anode 220 in the first electroplating may be a constant current as shown in FIG. 15A, a stepwise current in which the current increases stepwise with time as shown in FIG. 15B, or a pulse current which repeats feeding of a current and stop of the feeding as shown in FIG. 15C.

In order to promote the bottom-up growth of plating, an average current density in the first electroplating is preferably 0.1 mA/cm$^2$ to 10 mA/cm$^2$, more preferably 0.1 mA/cm$^2$ to 5 mA/cm$^2$. When an average current density in the first electroplating is lower than 0.1 mA/cm$^2$, it takes a long time to fill the via holes 12 with the first plated film, leading to lowering of the productivity.

Second electroplating is carried out under second plating conditions, using the seed layer 14 and the first plated film 36 as a feeding layer, after the termination of filling of the first plated film 36 into the via holes 12. Preferably, the filling of the first plated film 36 into the via holes 12 is terminated before the via holes 12 become entirely filled with the first plated film 36.

Figure 16A:
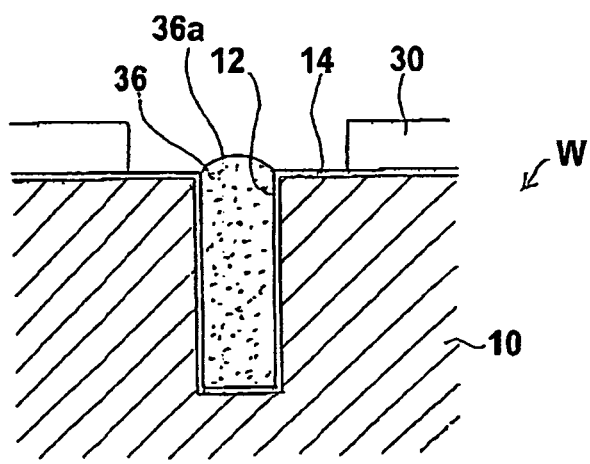
FIG. 16A is a diagram illustrating the state of a first plated film in a via hole entirely filled with the first plated film, and FIG. 16B a diagram illustrating the state of the first plated film in the via hole before the via hole becomes entirely filled with the first plated film.

In particular, the first electroplating for filling of the first plated film 36 into the via holes 12 is carried out in a bottom-up manner, as described above. If the via holes 12 are entirely filled with the first plated film 36 by the bottom-up plating, the surface 36a of the plated film 36 in each via hole 12 generally takes a convex shape with a raised central portion, as shown in FIG. 16A. This is due to the effect of an additive that promotes the growth of the plated film from the center of each via hole 12. This effect tends to continue for a certain time even during the second electroplating under the second plating conditions after the termination of the first electroplating. Accordingly, if a second plated film 38 is formed by carrying out the second electroplating in the below-described manner under the second plating conditions after entirely filling the via holes 12 with the first plated film 36, the second plated film 38 formed will be thicker in its portions corresponding to the centers of the via holes 12 than in the other portions. Such local variation in the thickness of the plated film will cause problems in later bonding, and therefore should be prevented.

Figure 16B:
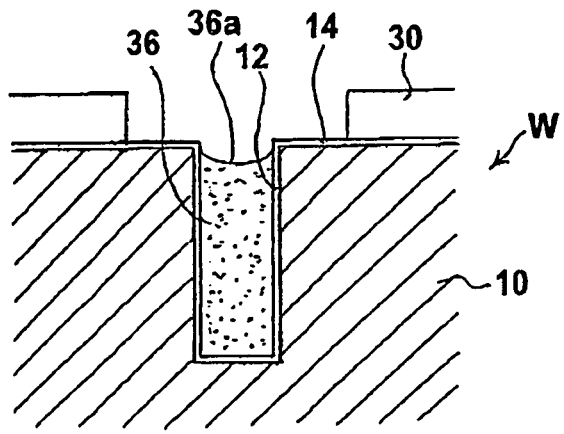

Thus, the first plating conditions are preferably changed to the second plating conditions before the via holes 12 become entirely filled with the first plated film 36, i.e., when the first plated film 36 embedded in each via hole 12 still has a somewhat concave surface, as shown in FIG. 16B. This can prevent the surface of the first plated film 36 embedded in each via hole 12 from taking a convex shape.

The second plated film 38, formed by the second electroplating carried out under the second plating conditions, is to form electrode pads or re-wiring portions, as described below, and is therefore formed under such conditions as to form a plated film having a uniform thickness over the entire substrate surface. Thus, even when the surface 36a of the first plated film 36 in each via hole 12 still has a somewhat concave surface, a second plated film 38 having a flat surface can be formed in the resist openings 32 provided that the aspect ratio of the resist openings 32 is not more than 2, preferably not more than 1.

Figure 13A:
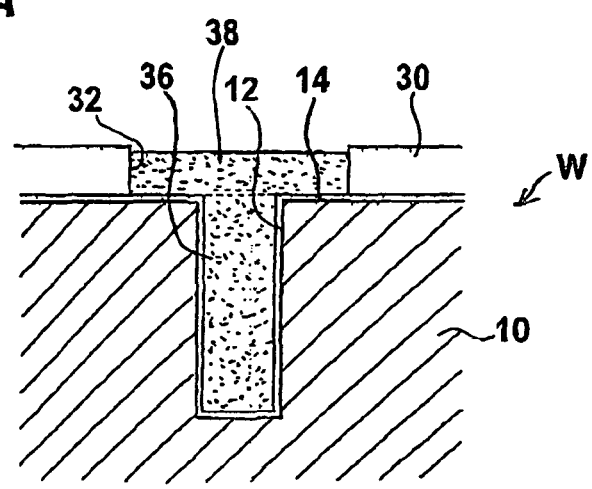
FIGS. 13A and 13B are diagrams illustrating the subsequent steps of the process according to the present invention.

In the second electroplating carried out under the second plating conditions using the seed layer 14 and the first plated film 36 as a feeding layer, the second plated film 38 is allowed to grow on the seed layer 14 and the first plated film 36, both exposed in the resist openings 32 of the resist pattern 30, as shown in FIG. 13A.

In the second electroplating, the seed layer 14 and the first plated film 36, serving as a feeding layer, are present only in the bottoms of the resist openings 32 surrounded by the resist pattern 30. Accordingly, the second plated film 38 grows from the bottoms of the resist openings 32 by through-mask plating when electroplating is carried out. There is, therefore, little fear of the formation of defects, such as voids and seams, in the second plated film 38. However, there is a possibility of disproportion in the pattern configuration of the second plated film 38 due to the flow rate distribution of the plating solution in the resist pattern 30. This phenomenon is likely to occur when supply of copper ions is insufficient for the plating rate, i.e. when plating proceeds in a diffusion-controlled region. In this case, therefore, optimization of the flow conditions of the plating solution, e.g., by mechanical stirring or air stirring is important rather than the composition of the plating solution and the current density.

The "air stirring" herein refers to a stirring method which involves moving a stirring paddle parallel to a substrate during plating to stir a plating solution and, at the same time, supplying bubbles of, e.g., air or nitrogen gas to the plating solution so that the bubbles supplied will flow along an entire surface of the substrate.

In this embodiment, therefore, a plating solution is supplied in an upward flow into the plating tank 186, and the stirring paddle 232 is reciprocated at a high velocity approximately parallel to the substrate W to move the plating solution during plating. This can promote the supply of the plating solution into the resist openings 32 and reduce the disproportion in the pattern configuration. Besides simple reciprocation of the stirring paddle 232, it is also possible to reciprocate the paddle while slowly moving the center of reciprocation in one direction.

Though, in this embodiment, the reciprocating stirring paddle 232 is used to stir the plating solution during plating, it is also possible to use a rotating stirring paddle. The supply of the plating solution into the resist openings can be promoted and the disproportion in the pattern configuration can be reduced also by supplying the plating solution in an upward flow into, e.g., a jet flow-type plating apparatus, and rotating the stirring paddle with respect to a surface of a substrate to move the plating solution during plating. In view of the relatively slow movement of the plating solution in the vicinity of the center of rotation of the stirring paddle, it is possible to position the center of rotation of the stirring paddle at a distance from the center of the substrate, and to rotate the stirring paddle while slowly moving the center of rotation with respect the substrate surface, so that a uniform flow of the plating solution will form over the entire substrate surface.

According to this embodiment, the plating conditions, such as electric current, the composition of the plating solution and stirring conditions for the plating solution, can be optimized for the respective configurations of the via holes 12 and the resist openings 32, and the completeness of the first plated film 36 and the second plated film 38 and the efficiency of film formation thereof can be increased by carrying out the first electroplating under the first plating conditions to fill the first plated film 36 into the via holes 12, and then carrying out the second electroplating under the second plating conditions to allow the second plated film 38 to grow in the resist openings 32 of the resist pattern 30 formed at a predetermined position on the substrate surface. Furthermore, by carrying out the first electroplating to fill the first plated film 36 into the via holes 12 and the second electroplating to allow the second plated film 38 to grow in the resist openings 32 of the resist pattern 30 successively after forming the resist pattern 30 in advance, it becomes possible to shorten the plating time and increase the productivity.

From the viewpoint of ensuring an area for devices, the total area of the via holes 12 is generally at most about 1%, and in no way exceeds several % of the total area of a substrate. The area of re-wirings or electrode pads, on the other hand, is generally several to several tens of % of the total area of a substrate. Accordingly, in the first electroplating under the first plating conditions, it is only necessary to supply an electric current required to fill the via holes 12 with the first plated film 36. On the other hand, it will take a long plating time if the second electroplating under the second plating conditions for the formation of the second plated film 38, which becomes re-wirings or electrode pads, is carried out at the same current as the first electroplating. In view of this, an average current value in the second plating conditions is preferably higher than an average current value in the first plating conditions.

It is generally desirable to increase the current value with an increase in the plating area. Thus, it is desirable that an average current value in the second plating conditions be at least twice, usually about 10 times an average current value in the first plating conditions. It is therefore desirable that when carrying out the first electroplating and the second electroplating successively in the same plating tank, the plating power source of the plating tank have a feeding current range covering at least tenfold increase of current. As described above, a stepwise current or a pulse current may be employed in the first electroplating under the first plating conditions. Also in that case, an average current value in the second electroplating is preferably higher than an average current value in the first electroplating.

The first plated film 36 embedded in the via holes 12 is used as via plugs which connect semiconductor chips by the most direct way to achieve the production of a higher-performance and smaller-sized electronic product, as described below. It is therefore desirable that the first plated film 36 have a high electrical conductivity, i.e., a low electrical resistance. Though gold, silver, copper, etc. may be mentioned as such metals, only copper or copper-based alloy plating is capable of industrial bottom-up plating. Also from the viewpoint of cost, it is preferred to use copper or a copper alloy at least for the first plated film 36 to be formed under the first plating conditions.

With regard to the second plated film 38 to be formed by the second electroplating carried out under the second plating conditions, it is desirable to use a highly conductive metal also for the second plated film. In addition, it is desirable in view of the productivity to successively form the first plated film 36 and the second plated film 38, both composed of the same metal. Therefore, the second plated film 38 is also preferably composed of copper or a copper alloy.

Figure 13B:
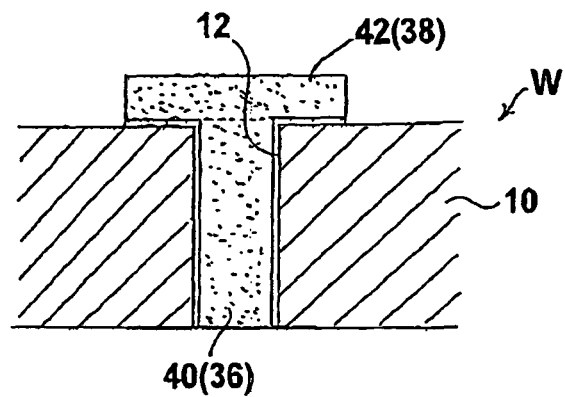

Next, as shown in FIG. 13B, the extra seed layer 14 and the resistor pattern 30 are removed from the surface of the substrate W and, at the same time, the back surface of the substrate W is polished and removed until the bottom of the first plated film 36 embedded in the via holes 12 becomes exposed, thereby obtaining a conductive structure having via plugs 40 of copper, composed of the first plated film 36 embedded in the via holes 12, and having electrode pads 42 composed of the second plated film 38 which has been formed in the resist openings 32 of the resist pattern 30. The thickness of the electrode pads 42 is, for example, several tens of µm.

Figure 17A:
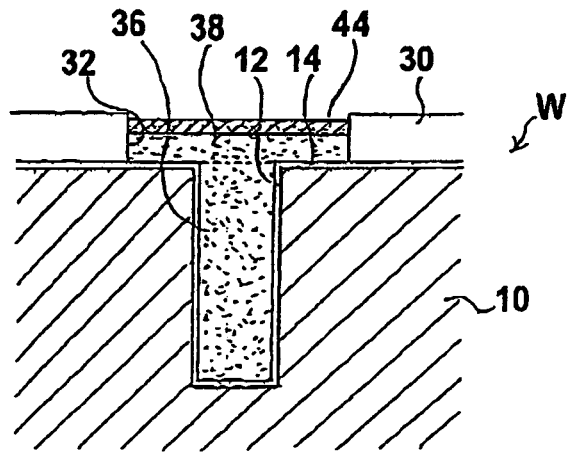
FIGS. 17A and 17B are diagrams illustrating the steps, after the formation of a first plated film, of a process for the production of a conductive structure, according to another embodiment of the present invention.
Figure 17B:
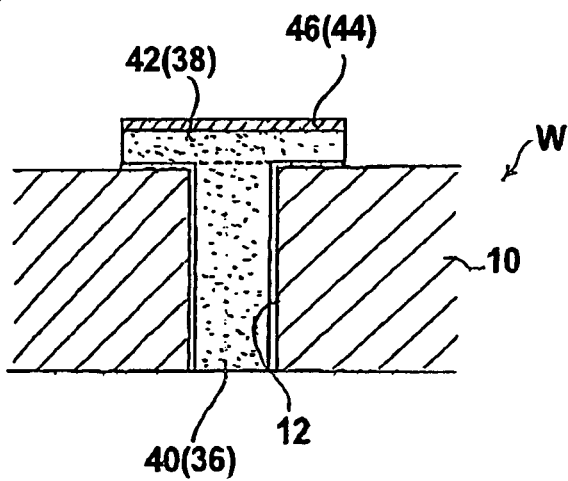

FIGS. 17A and 17B illustrate a process for the production of a conductive structure according to another embodiment of the present invention. As in the preceding embodiment, a first plated film 36 is filled into via holes 12 by first electroplating carried out under first plating conditions, as shown in FIG. 12C. Thereafter, as shown in FIG. 17A, second electroplating is carried out under second plating conditions to allow a second plated film 38 to grow halfway to a top of a resist pattern 30, and then third electroplating is carried out under third plating conditions to allow a third plated film 44 to grow on the second plated film 38.

The third plated film 44 is for use as a bonding layer (bonding material) 46 for bonding between chips, as described below. The successive formation of the third plated film 44 on the second plated film 38, which is for forming electrode pads or posts, can eliminate the need to provide a new resist pattern, which leads to increased cost, for forming the bonding layer. It is desirable that the third plating conditions, such as the composition of the plating solution used and the current density, be optimized for the third electroplating. The third plating conditions may therefore be different from the first and second plating conditions.

As described above, the third plated film 44 is for use as a bonding material, as described above, for which bonding properties take priority over electrical conductivity. Thus, a metal such as tin or a tin alloy, which is different from metals, such as copper, for use in the first plated film 36 and the second plated film 38, is preferably used.

Next, as shown in FIG. 17B, the extra seed layer 14 and the resistor pattern 30 are removed from the surface of the substrate W and, at the same time, the back surface of the substrate W is polished and removed until the bottom of the first plated film 36 embedded in the via holes 12 becomes exposed, thereby obtaining a conductive structure having via plugs 40 of copper, composed of the first plated film 36 embedded in the via holes 12, and having electrode pads 42 composed of the second plated film 38 which has been formed in the resist openings 32 of the resist pattern 30, and a bonding layer 46 as a bonding material, composed of the third plated film 44 which has been formed on the second plated film 38. The thickness of the bonding layer 46 is, for example, several tens of µm.

A description will now be made of a process for forming the first plated film 36 shown in FIG. 12C and the second plated film 38 shown in FIG. 13A successively by the plating facility (copper electroplating facility) shown in FIG. 5.

First, a substrate W, as shown in FIG. 12B, having a plurality of upwardly-open via holes (recesses for via plugs) 12 formed in a base 10 of, e.g., silicon, and a seed layer (conductive film) 14, which serves as a feeding layer upon electroplating, formed in an entire surface of the substrate W, is provided. The substrate W is placed, with its front surface (surface to be plated) facing upwardly, in a substrate cassette, and the substrate cassette is mounted on the loading/unloading port 120.

One of the substrates W is taken out of the substrate cassette mounted on the loading/unloading port 120 by the first transfer robot 128 and placed on the aligner 122 to align an orientation flat or a notch of the substrate with a predetermined direction. On the other hand, two substrate holders 160, which have been stored in a vertical state in the stocker 164, are taken out by the second transfer robot 174a, rotated through 90° so that the substrate holders 160 are brought into a horizontal state, and then placed in parallel on the substrate attachment/detachment stages 162.

The substrates W aligned the orientation flat or the notch thereof with a predetermined direction are transferred and loaded into the substrate holders 160 placed on the substrate attachment/detachment stages 162 in a state such that peripheral portions of the substrates are sealed. The two substrate holders 160, which have been loaded with the substrates W, are simultaneously retained, lifted, and then transferred to the stocker 164 by the second transfer robot 174a. The substrate holders 160 are rotated through 90° into a vertical state and lowered so that the two substrate holders 160 are held (temporarily stored) in the stocker 164 in a suspended manner. The above operation is carried out repeatedly in a sequential manner, so that substrates are sequentially loaded into the substrate holders 160, which are stored in the stocker 164, and are sequentially held (temporarily stored) in the stocker 164 at predetermined positions in a suspended manner.

On the other hand, the two substrate holders 160, which have been loaded with the substrates and temporarily stored in the stocker 164, are simultaneously retained, lifted, and then transferred to the pretreatment device 127 by the second transfer robot 174b. Each substrate is immersed in a pretreatment liquid such as pure water held in the pretreatment tank 127 to thereby carry out a pretreatment (rinsing pretreatment). A dissolved oxygen concentration of pure water used as the pretreatment liquid is preferably controlled not less than 2 mg/L by using a vacuum deaerator or introducing inactive gas. Next, the substrate holders 160, which have been loaded with the substrates, are transferred to the activation treatment device 166 in the same manner as described above. Each substrate is immersed in an inorganic acid solution, such as sulfuric acid or hydrochloric acid, or an organic acid solution, such as citric acid or oxalic acid, held in the activation treatment tank 183 to thereby etch an oxide film, having a large electric resistance, formed on the surface of the seed layer so as to expose a clean metal surface. A dissolved oxygen concentration of the acid solution used in this activation treatment can be controlled as in the case of pure water for pretreatment. The substrate holders 160, which have been loaded with the substrates, are transferred to the first rinsing device 168a in the same manner as described above to rinse the surfaces of the substrates with pure water held in the rinsing tanks 184a.

After rinsing the surfaces of the substrates, the substrate holders 160, which have been loaded with the substrates, are transferred to the plating apparatus 170, where each of the substrates is hung and supported on the plating tank 186 and immersed in the plating solution Q in the plating tank 186 to carry out plating of the surface of the substrate W.

Before initiating first electroplating under first plating conditions, it is possible to allow the substrate W held by each substrate holder 160 to be immersed in the plating solution Q without application of an electric current for a predetermined time so as to replace cleaning water remaining in the via holes 12 with the plating solution. The predetermined time is preferably not more than one minute. If the predetermined time is too long, the seed layer will dissolve in the plating solution.

As described above, first electroplating of the substrate is carried out under first plating conditions to fill a first plated film 36 into the via holes 12, as shown in FIG. 12C. The first plating conditions are bottom-up plating conditions which allow the plated film to grow preferentially from the bottoms of the via holes 12. After the termination of filling of the first plated film 36 into the via holes 12, the first plating conditions are switched to second plating conditions, and second electroplating is carried out under second plating conditions to allow a second plated film 38 to grow on the conductive film 14 and the first plated film 36, both exposed in the resist openings 32 of the resist pattern 30, as shown in FIG. 13A. The second plating conditions, for example, use an electric current whose average value is at least twice, usually at least 10 times higher than that of the first plating conditions, and uses an optimized movement of the stirring paddle 232 in stirring the plating solution Q.

It is also possible to carry out the first electroplating under the first plating conditions and the second electroplating under the second plating conditions by using plating solutions of different compositions.

After the termination of the second electroplating, the substrate holders 160, which have been loaded with the substrates, are held again by the second transfer robot 174b and drawn up from the plating tanks 186.

Thereafter, the substrate holders 160 are transferred to the second rinsing device 168b in the same manner as described above. The substrate holders 160 are immersed in pure water in the rinsing tanks 184b to clean the surfaces of the substrates with pure water. Then, the substrate holders 160, which have been loaded with the substrates, are transferred to the blowing device 172 in the same manner as described above. In the blowing device 172, inert gas or air is injected toward the substrates to blow away a plating solution and water droplets attached to the substrate holders 160. Thereafter, the substrate holders 160, which have been loaded with the substrates, are returned to predetermined positions in the stocker 164 and held in a suspended state in the same manner as described above.

The second transfer robot 174b sequentially performs the above operation repeatedly so that the substrate holders 160, which have been loaded with the plated substrates, are sequentially returned to predetermined positions in the stocker 164 and held in a suspended manner. On the other hand, the two substrate holders 160, which have been loaded with the plated substrates, are simultaneously retained and placed on the substrate attachment/detachment stages 162 by the second transfer robot 174a in the same manner as described above.

The first transfer robot 128 disposed in the clean space 114 takes the substrate out of one of the substrate holders 160 on the substrate attachment/detachment stages 162, and transfers the substrate to one of the cleaning/drying devices 124. In the cleaning/drying device 124, the substrate, held in a horizontal position with the front surface facing upwardly, is cleaned with pure water and then spin-dried by rotating the substrate at a high speed. Thereafter, the substrate is returned by the first transfer robot 128 into the substrate cassette mounted on the loading/unloading port 120, thereby completing the series of plating processing steps. A substrate W, as shown in FIG. 13A, having the first plated film 36, forming via plugs 40, embedded in the via holes 12, and having the second plated film 38, forming electrode pads 42, formed in the resist openings 32 of the resist pattern 30, is thus obtained.

When a third plated film 44 is to be formed on the second plated film 38 by third electroplating carried out under third plating conditions, as shown in FIGS. 17A and 17B, the substrate W after the formation of the second plated film 38 in the same manner as described above is transferred to another electroplating apparatus, where the third plated film 44 is formed.

A description will now be made of a plating apparatus according to an embodiment of the present invention, which is adapted to carry out plating, e.g., with copper of a surface (surface to be plated) of a substrate, such as a semiconductor wafer, so as to fill copper into via holes having a diameter of, e.g., 1 μm to 100 μm.

Figure 18:
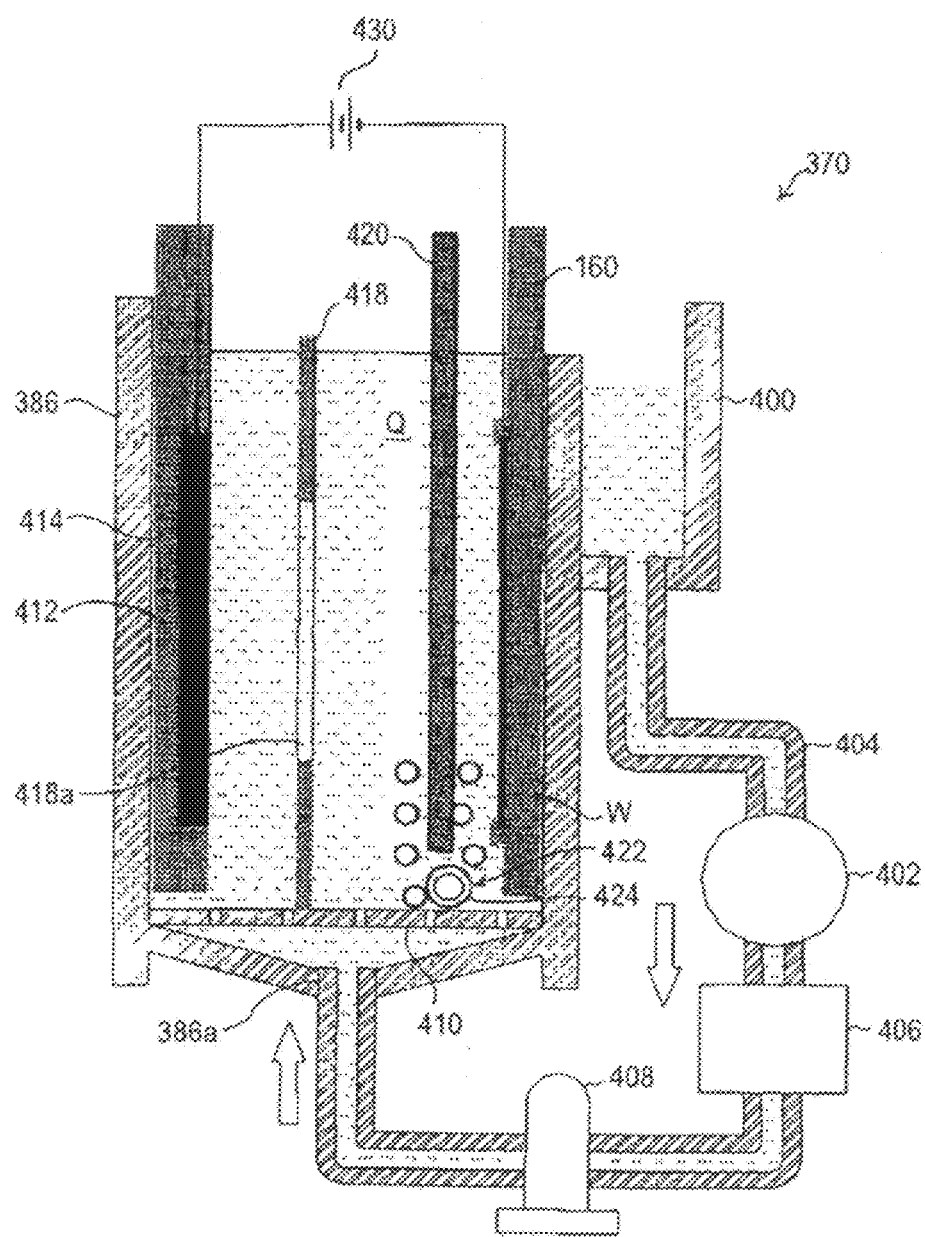
FIG. 18 is a schematic cross-sectional view of a plating apparatus according to an embodiment of the present invention.

FIG. 18 is a vertical sectional front view of a plating apparatus 370 according to an embodiment of the present invention. The plating apparatus 370 can be used in place of the plating apparatus 170 of the plating facility shown in FIG. 5.

As shown in FIG. 18, the plating apparatus 370 includes a plating tank 386 for holding therein a certain amount of plating solution Q in which a substrate W, held by the substrate holder 160 (see FIG. 6) with its peripheral portion watertightly sealed and its surface (surface to be plated) exposed, is to be immersed in a vertical position. In this embodiment, a plating solution, which, in addition to copper ions, a supporting electrolyte and halogen ions, contains at least one of an organic sulfur compound, a polymer and an organic nitrogen compound, is used as the plating solution Q. Sulfuric acid is preferably used as the supporting electrolyte, and chlorine ions are preferably used as the halogen ions.

An overflow tank 400 for receiving the plating solution Q that has overflowed an edge of the plating tank 386 is provided around an upper portion of the plating tank 386. One end of circulation piping 404, which is provided with a pump 402, is connected to a bottom of the overflow tank 400, and the other end of the circulation piping 404 is connected to a plating solution supply inlet 386a provided at a bottom of the plating tank 386. The plating solution Q in the overflow tank 400 is returned into the plating tank 386 by the actuation of the pump 402. Located downstream of the pump 402, a constant-temperature unit 406 for controlling the temperature of the plating solution Q, and a filter 408 for filtering out foreign matter contained in the plating solution are interposed in the circulation piping 404. A bottom plate 410, having a large number of plating solution passage holes therein, is disposed in the bottom of the plating tank 386.

An anode 412 having a circular shape corresponding to the shape of the substrate W is held by an anode holder 414 and provided vertically in the plating tank 186. When the plating solution Q is filled into the plating tank 386, the anode 412 becomes immersed in the plating solution Q and faces the substrate W held by the substrate holder 160 and disposed at a predetermined position in the plating tank 386. Also in the plating tank 386, a regulation plate 418 of dielectric material, having a central hole 418a, for regulating the distribution of electric potential in the plating tank 386, is disposed between the anode 412 and the substrate holder 160 disposed at a predetermined position in the plating tank 386. A lower end of the regulation plate 418 reaches the bottom plate 410.

Between the regulation plate 418 and the substrate holder 160 to be disposed at a predetermined position in the plating tank 386 is disposed a plurality of vertically-extending paddles 420, arranged side by side at equal intervals, which reciprocate parallel to the substrate W to stir the plating solution Q between the substrate holder 160 and the regulation plate 418. The paddles 420 constitute a plating solution stirring section.

Figure 19:
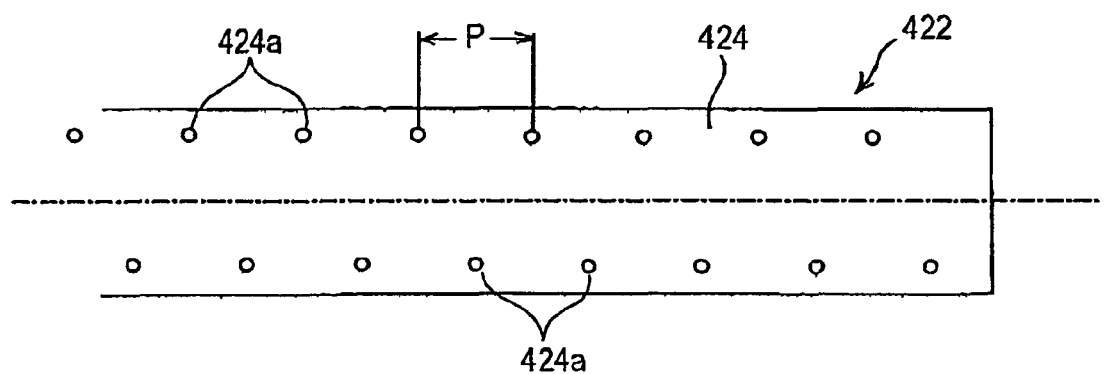
FIG. 19 is a bottom view of a bubble supply section of the plating apparatus shown in FIG. 18.
Figure 20:
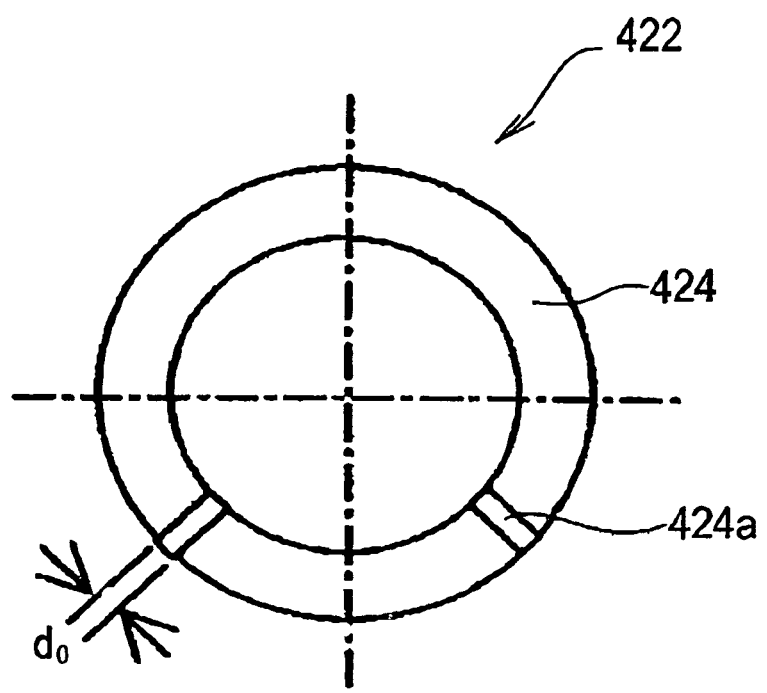
FIG. 20 is a cross-sectional view of the bubble supply section of the plating apparatus shown in FIG. 18.

A bubble supply section 422 is disposed in the bottom of the plating tank 386 at a position above the bottom plate 410 and in the vicinity of the lower ends of the paddles (plating solution stirring section) 420, in particular at a position under the lower ends of the paddles 420 but slightly nearer to the substrate W. As shown in FIGS. 19 and 20, the bubble supply section 422 is comprised of a hollow pipe 424 having through holes 424a arranged in two lines at a predetermined pitch P along the length direction of the hollow pipe 424. The bubble supply section 422 extends approximately overall width of the plating tank 386. The diameter $d_0$ of the through-holes 424a is, for example, 0.1 mm to 2.0 mm. The through-holes 424a are provided in the lower half of the hollow pipe 424 so that the plating solution Q in the plating tank 386 will not flow into the hollow pipe 424.

It is also possible to dispose the hollow pipe 424, constituting the bubble supply section 422, such that the through-holes 424a are positioned in the vicinity of plating solution passage holes of the bottom plate 410 of the plating tank 386. This allows bubbles to flow efficiently along the surface of the substrate W in a flow of the plating solution.

During plating, bubbles of, e.g., air or nitrogen gas are supplied from the bubble supply section 422, comprised of the hollow pipe 424, to the plating solution Q facing the surface (surface to be plated) of the substrate W, held by the substrate holder 160 and disposed at a predetermined position, e.g., at a supply rate of 0.1 L/min to 10 L/min, preferably 1 L/min to 5 L/min, so that the bubbles flow along the entire surface of the substrate W. Though not shown diagrammatically, it is also possible to tilt the substrate holder 160 at an angle of 0.1° to 1.0° with respect to the vertical direction in order for bubbles to flow efficiently along the entire surface of the substrate W.

Figure 21:
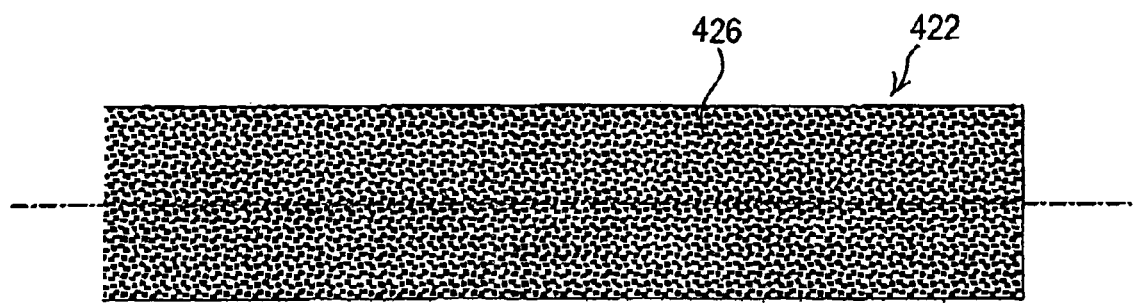
FIG. 21 is a bottom view of another bubble supply section.
Figure 22:
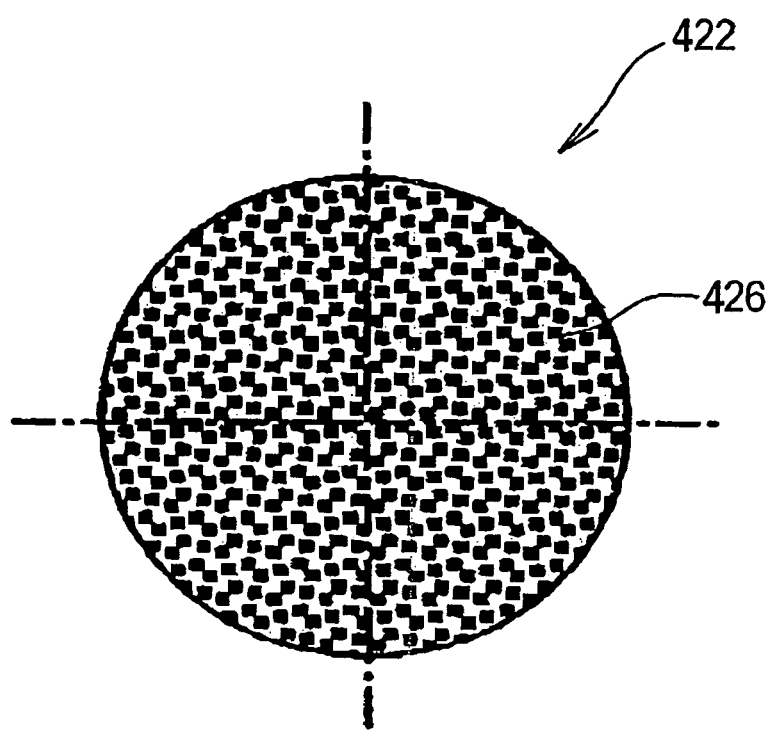
FIG. 22 is a cross-sectional view of another bubble supply section.

As shown in FIGS. 21 and 22, it is also possible to use a porous body 426, which may be a porous plastic or ceramic body, as the bubble supply section 422. The use of the porous body 426 can simplify the structure of the bubble supply section 422.

The plating apparatus 370 is provided with a plating power source 430 of which the anode is connected via a conducting wire to the anode 412 and the cathode is connected via a conducting wire to the substrate W during plating.

In operation of the plating apparatus 370, the plating tank 386 is first filled with a predetermined amount of plating solution Q. The substrate holder 160 holding the substrate W is then lowered to dispose the substrate W at a predetermined position where the substrate W is immersed in the plating solution Q in the plating tank 386, and the anode and the cathode of the plating power source 430 are connected to the anode 412 and the substrate W, respectively, to carry out plating of the surface of the substrate W. During the plating, the paddles 420 is moved parallel to the substrate W to sir the plating solution Q between the regulation plate 418 and the substrate W while bubbles of, e.g., air or nitrogen gas are supplied from the bubble supply section 422 to the plating solution Q facing the surface (surface to be plated) of the substrate W, e.g., at a supply rate of 0.1 L/min to 10 L/min, preferably 1 L/min to 5 L/min. The pump 402 of the circulation piping 404 is driven, as necessary, to circulate the plating solution Q while cooling the plating solution Q to keep it at a predetermined temperature.

After the elapse of a predetermined time, the application of voltage between the anode 412 and the substrate W, the reciprocation of the paddles 420 and the supply of bubbles from the bubble supply section 422 are stopped to terminate the plating.

Figure 1A:
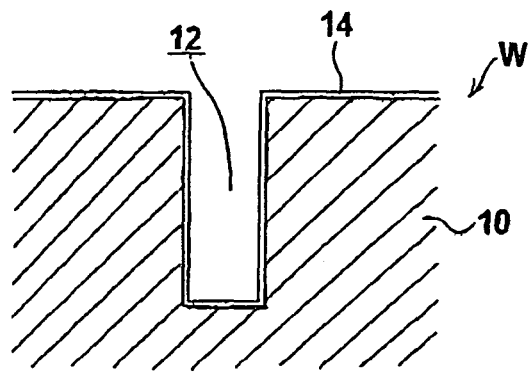
FIGS. 1A through 1C are diagrams illustrating the first-to-polishing steps of a conventional process for the production of a conductive structure having, in its interior, via plugs vertically penetrating the structure.
Figure 1B:
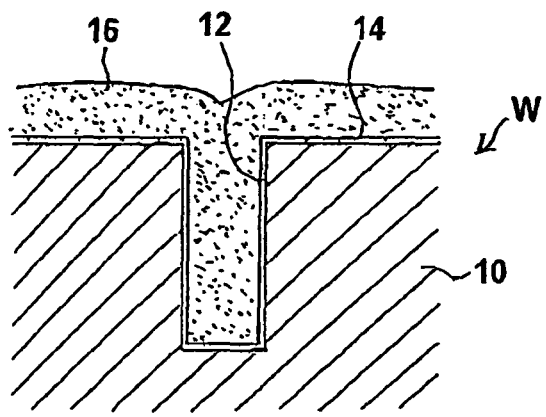
Figure 1C:
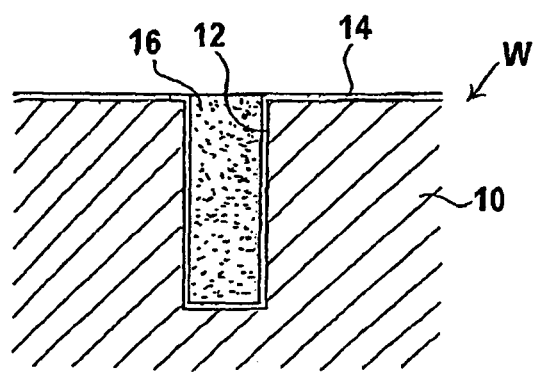
Figure 2A:
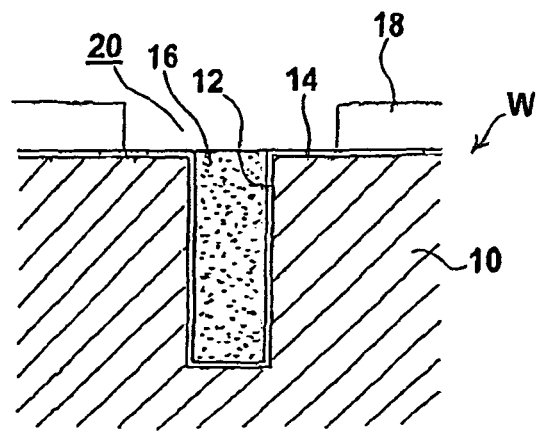
FIGS. 2A through 2C are diagrams illustrating the post-polishing steps of the conventional process.
Figure 2B:
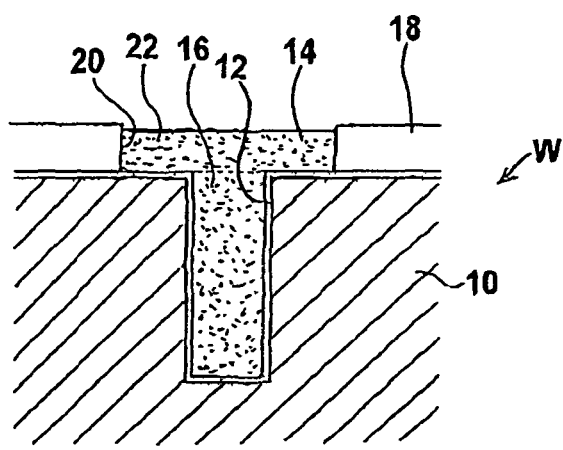
Figure 2C:
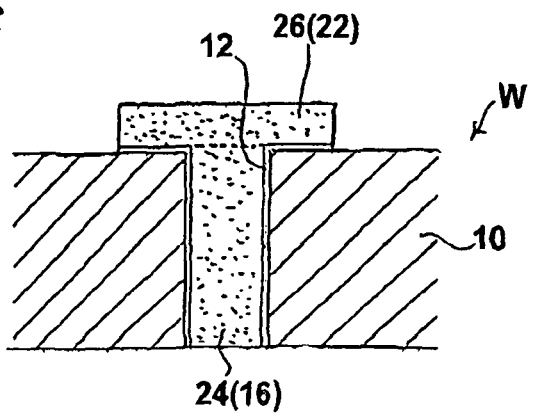
Figure 3A:
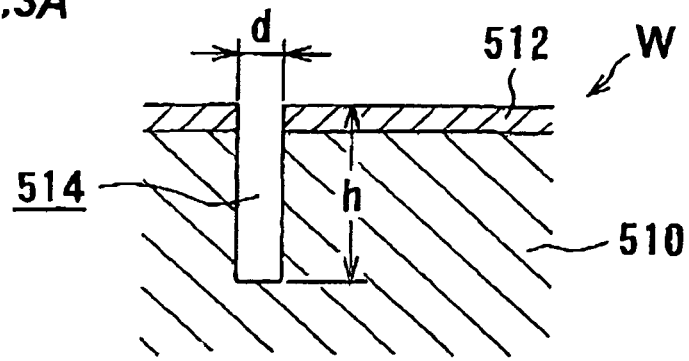
FIGS. 3A through 3D are diagrams illustrating a process for the production of an interposer or a spacer having copper via plugs vertically penetrating in its interior.
Figure 3B:
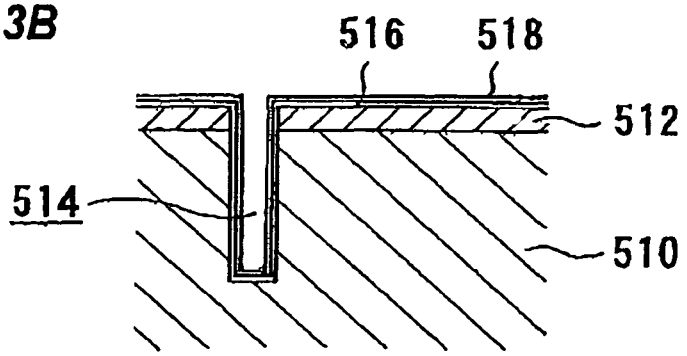
Figure 3C:
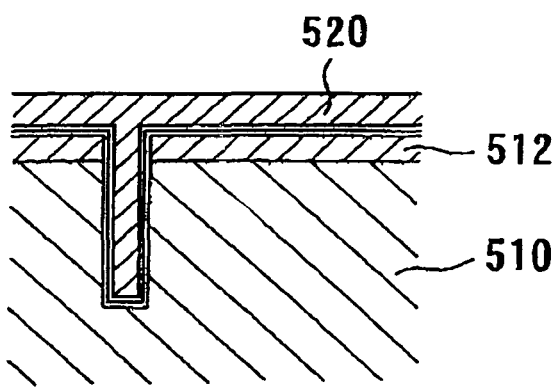
Figure 3D:
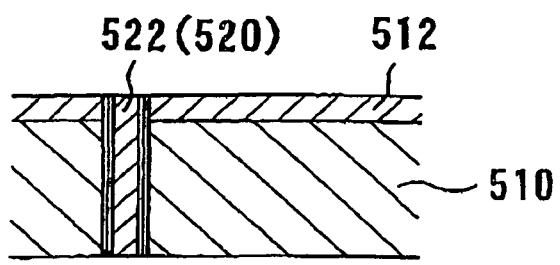
Figure 4:
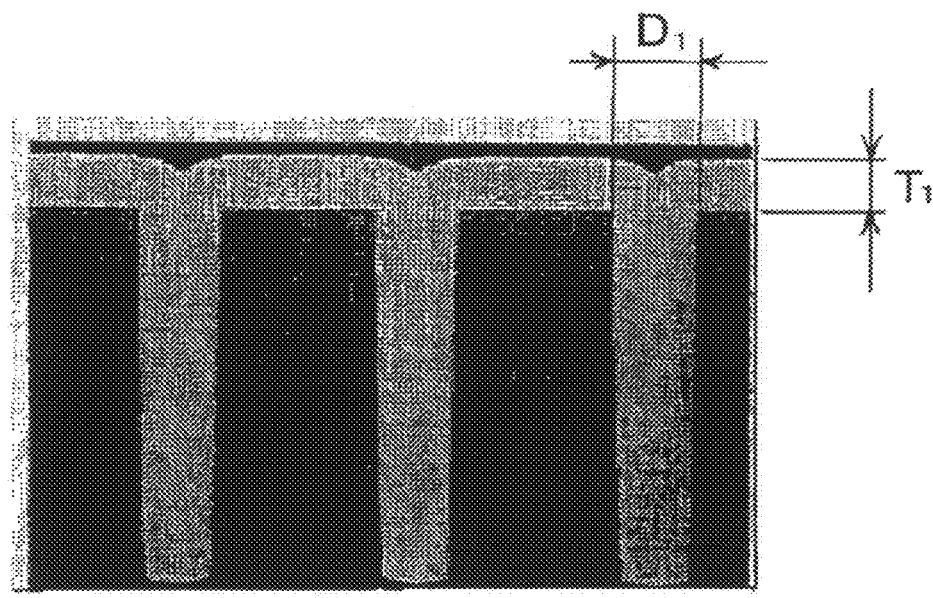
FIG. 4 is a diagram illustrating the state of a plated film which has been filled into holes by conventional plating.

The plating apparatus 370 can be used in place of the plating apparatus 170 shown in FIG. 5. For example, a substrate W, as shown in FIG. 3B, is provided which has been prepared by depositing an insulating film 512 of, e.g., $SiO_2$ on a surface of a base 510 of, e.g., silicon, forming a plurality of upwardly-open via holes 514, forming a barrier layer 516 of, e.g., TaN on an entire surface and then forming a (copper) seed layer 518, which serves as a feeding layer upon electroplating, on a surface of the barrier layer 516. The substrate W is subjected to a series of plating processing steps as in the preceding embodiment, thereby filling copper into the via holes 514 and depositing a copper film 520 on the insulating film 512, as shown in FIG. 3C.

Though, in the above-described embodiment, the pretreatment device 126 is disposed in the plating space 116, and the pretreatment of a substrate is carried out while holding it with the substrate holder 160, it is also possible to dispose the pretreatment device in the clean space 114, and carry out the series of plating processing steps after the pretreatment while holding a substrate after the pretreatment with the substrate holder.

Example 1

A test specimen was prepared by forming a 100-nm thick Ti barrier layer by PVD on a silicon wafer substrate having holes (via holes) of a diameter of 20 μm and a depth of 50 μm, and then forming a 500-nm thick copper seed layer by PVD on the barrier layer. Using the plating apparatus shown in FIG. 18 and a copper sulfate plating solution having the following composition, copper electroplating of a surface of the test specimen (substrate) was carried out under the following plating conditions:

Composition of Plating Solution
    Copper sulfate pentahydrate: 200 g/L
    Sulfuric acid: 50 g/L
    Chlorine: 60 mg/L
    Additives: sulfur compound, polymer, nitrogen compound, etc.
Plating Conditions
    Current density: 5 mA/cm$^2$ Plating time: 30 min
Paddle movement velocity (average): 200 mm/sec
Number of paddles: 5
Circulation flow rate: 2 L/min
Supply of bubbles: air was supplied at 2 L/min from 0.5-mm through-holes of a hollow pipe Example 2

Electroplating of the same test specimen was carried out in the same manner as in Example 1 except for using a bubble supply section comprised of the porous body (porous ceramic body) shown in FIGS. 21 and 22, and supplying air at 150 ml/min from the porous body.

Comparative Example 1

Electroplating of the same test specimen was carried out in the same manner as in Example 1 except for not carrying out stirring of the plating solution with the paddles.

Comparative Example 2

Electroplating of the same test specimen was carried out in the same manner as in Example 1 except for not carrying out stirring of the plating solution with the paddles, and supplying air bubbles at 150 ml/min.

Figure 23:
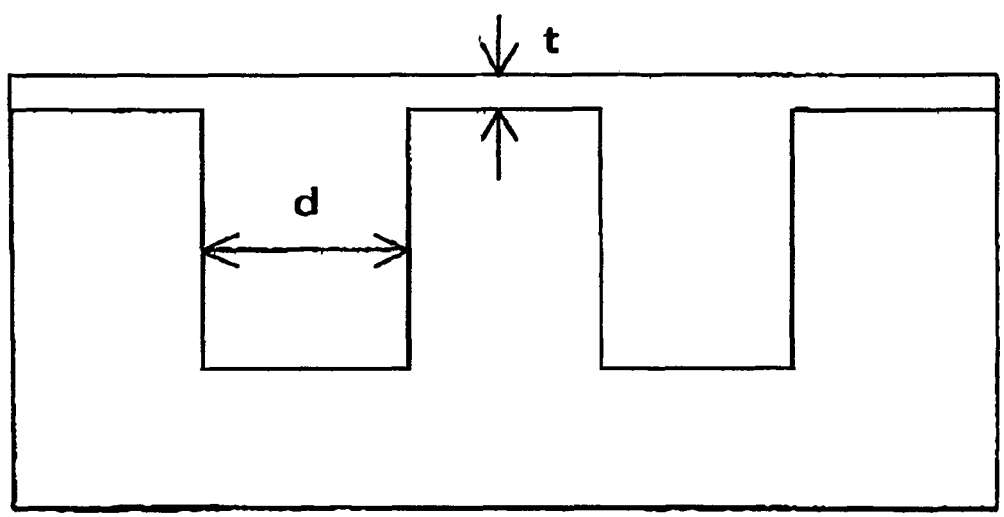
FIG. 23 is a diagram illustrating parameters for evaluation of a plated film.

Hole portions were cut out from the respective test samples, having a copper plated film, obtained in Examples 1, 2 and Comp. Examples 1, 2 and the cut surfaces were observed. The respective plated films were evaluated in terms of the parameters illustrated in FIG. 23: hole diameter "d"; the thickness "t" of the plated film formed on the surface, outside the holes, of the test specimen (substrate); and evaluation index t/d. The results are shown in Table 1 below. An evaluation index value of not more than 0.5 indicates the fact that plating proceeds preferentially in the holes, so that the thickness of the copper plated film, formed on the substrate surface outside the holes which are filled with copper, is smaller than the radius of the holes.

TABLE 1

| Plating conditions | Hole diameter (d) | Thickness (t) of plated film | Evaluation index (t/d) |
|---|---|---|---|
| Example 1 | 22.4 | 2.8 | 0.13 |
| Example 2 | 22.9 | 2.3 | 0.10 |
| Comp. Example 1 | 22.6 | voids | — |
| Comp. Example 2 | 22.8 | voids | — |

As can be seen from the data in Table 1, the evaluation indices of the samples of Examples 1 and 2 are much lower than 0.5, indicating the preferential growth of the plated film in the holes. Further, the holes of a diameter of 20 μm and a depth of 50 μm were found to be completely filled with copper without a defect, such as voids, in the samples of Examples 1 and 2. In contrast, the holes of the samples of the Comp. Examples 1 and 2 were found to be incompletely filled with copper, that is, voids were formed in the embedded copper.

Figure 24:
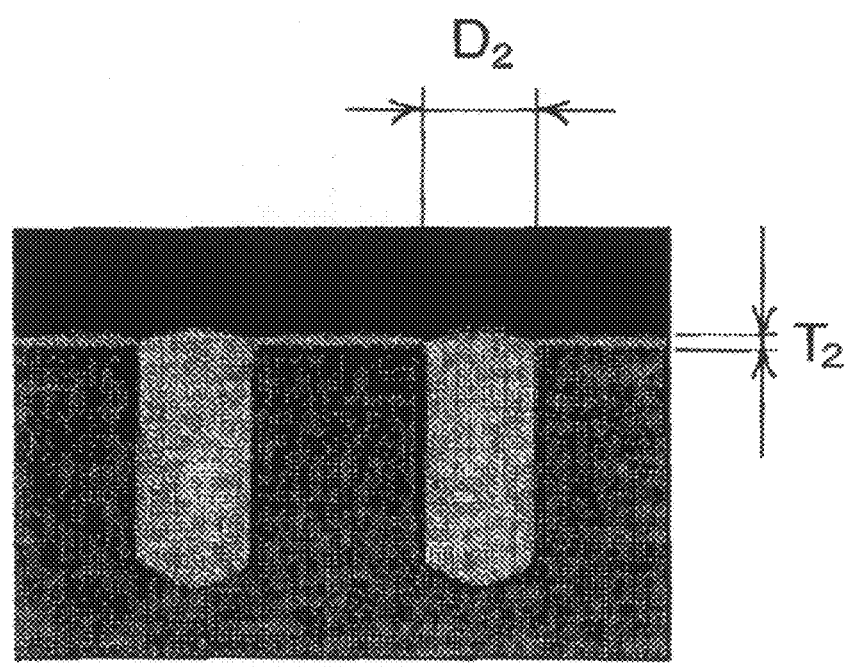
FIG. 24 is a diagram illustrating the state of a plated film which has been filled into holes by electroplating in Example 1.

FIG. 24 shows the state of the plated film which has been filled into the holes by electroplating in Example 1. It is considered that the copper plated film starts to grow from the bottoms of the holes immediately after the initiation of plating, the holes become half filled with copper without a defect in the middle stage of plating, and the holes become entirely filled without a defect in the embedded copper film while a thin copper film is formed on the surface, outside the holes, of the test specimen (substrate) in the later stage of plating. Thus, as shown in FIG. 24, the thickness $T_2$ of the plated film, formed on the surface of the test specimen (substrate) outside the holes, can be made materially smaller than the diameter $D_2$ of the holes.

While the present invention has been described with reference to the embodiments thereof, it will be understood by those skilled in the art that the present invention is not limited to the particular embodiments described above, but it is intended to cover modifications within the inventive concept.

The invention claimed is:

1. A method for forming a conductive structure having via plugs for use in three-dimensional packaging, comprising:
    preparing a substrate having upwardly-open via holes each having a diameter in a range of 10 μm to 20 μm and a depth of 70 μm to 150 μm, a conductive film formed on an entire surface of the substrate, including interior surfaces of the via holes, and a resist pattern formed at a predetermined position on the conductive film;
    carrying out first electroplating under first plating conditions, using the conductive film as a feeding layer, so as to fill the via holes with a first plated film to form the via plugs, the first electroplating including immersing the substrate in a first plating solution containing an additive for suppressing plating growth while stirring the first plating solution to suppress the plating growth at entrances to the via holes, an electric current in the first plating conditions is one of a constant current, a stepwise current, or a pulse current;
    after filling the via holes with the first plated film, carrying out second electroplating under second plating conditions, using the conductive film and the first plated film as a feeding layer, by immersing the substrate in a second plating solution so as to grow a second plated film on the first plated film and on a portion of the conductive film exposed in resist openings of the resist pattern until the second plated film having a flat surface is formed in the resist openings to thereby fill the via holes and resist openings without defects, the first plated film and the second plated film being composed of the same metal, an average current value in the second plating conditions being higher than an average current value in the first plating conditions; and
    during the second electroplating, supplying a nitrogen gas into the second plating solution facing a to-be-plated surface of the substrate.

2. The method for forming a conductive structure according to claim 1, wherein a height of the resist pattern is 5 μm to 100 μm.

3. The method for forming a conductive structure according to claim 1, wherein each of the first plated film and the second plated film are composed of copper or a copper alloy.

4. The method for forming a conductive structure according to claim 1, wherein the second electroplating is conducted until the second plated film grows to a point halfway between the surface of the first plated film and a top of the resist pattern, and then third electroplating is carried out under third plating conditions to so that a third plated film grows on the second plated film.

5. The method for forming a conductive structure according to claim 4, wherein the third plated film is composed of a metal different from a metal of the first plated film and a metal of the second plated film.

6. The method for forming a conductive structure according to claim 1, wherein the first plating conditions of the first electroplating includes an average current density in a range of 0.1 mA/cm² to 5.0 mA/cm².

7. The method for forming a conductive structure according to claim 6, wherein the second plating conditions of the second electroplating includes an average current density at least twice as large as an average current density of the first plating conditions of the first electroplating.

8. The method for forming a conductive structure according to claim 1, wherein the second plating conditions of the second electroplating includes an average current density at least twice as large as an average current density of the first plating conditions of the first electroplating.

9. The method for forming a conductive structure according to claim 1, wherein the first electroplating under the first plating conditions is switched to the second electroplating under the second plating conditions when a surface of the first plated film filling each of the via holes has a concave shape to thereby prevent the surface of the first plated film in each of the via holes from achieving a convex shape with a raised central portion.

10. The method for forming a conductive structure according to claim 1, wherein the additive of the first plating solution includes at least one of a sulfur compound, a polymer, and a nitrogen compound.

11. The method for forming a conductive structure according to claim 1, wherein a composition of the second plating solution is different than a composition of the first plating solution.

12. A method for forming a conductive structure having via plugs for use in three-dimensional packaging, comprising:

preparing a substrate having upwardly-open via holes each having a diameter in a range of 10 μm to 20 μm and a depth of 70 μm to 150 μm, a conductive film formed on an entire surface of the substrate, including interior surfaces of the via holes, and a resist pattern formed at a predetermined position on the conductive film;

carrying out first electroplating under first plating conditions, using the conductive film as a feeding layer, so as to fill the via holes with a first plated film to form the via plugs, the first electroplating including immersing the substrate in a first plating solution containing an additive for suppressing plating growth while stirring the first plating solution to suppress the plating growth at entrances to the via holes, an electric current in the first plating conditions is one of a constant current, a stepwise current, or a pulse current;

during the first electroplating, supplying a nitrogen gas into the first plating solution facing a to-be-plated surface of the substrate; and after filling the via holes with the first plated film, carrying out second electroplating under second plating conditions, using the conductive film and the first plated film as a feeding layer, by immersing the substrate in a second plating solution so as to grow a second plated film on the first plated film and on a portion of the conductive film exposed in resist openings of the resist pattern until the second plated film having a flat surface is formed in the resist openings to thereby fill the via holes and resist openings without defects, the first plated film and the second plated film being composed of the same metal, an average current value in the second plating conditions being higher than an average current value in the first plating conditions.

13. The method for forming a conductive structure according to claim 12, further comprising, during the second electroplating, supplying a gas into the second plating solution facing the to-be-plated surface of the substrate.

14. The method for forming a conductive structure according to claim 13, wherein the gas supplied into the second plating solution facing the to-be-plated surface of the substrate is nitrogen gas.

15. The method for forming a conductive structure according to claim 12, wherein a composition of the second plating solution is different than a composition of the first plating solution.

* * * * *